(12) United States Patent
Hovey et al.

(10) Patent No.: US 9,888,600 B2
(45) Date of Patent: *Feb. 6, 2018

(54) SUBSTRATE-FREE INTERCONNECTED ELECTRONIC MECHANICAL STRUCTURAL SYSTEMS

(71) Applicant: Nuvotronics, INC, Radford, VA (US)

(72) Inventors: Ian Hovey, Christianburg, VA (US); J. Robert Reid, Billerica, MA (US); David Sherrer, Cary, NC (US); Will Stacy, Blacksburg, VA (US); Ken Vanhille, Cary, NC (US)

(73) Assignee: NUVOTRONICS, INC, Radford, VA (US)

( * ) Notice: Subject to any disclaimer, the term of this patent is extended or adjusted under 35 U.S.C. 154(b) by 101 days.

This patent is subject to a terminal disclaimer.

(21) Appl. No.: 15/069,325

(22) Filed: Mar. 14, 2016

(65) Prior Publication Data

US 2016/0198584 A1    Jul. 7, 2016

Related U.S. Application Data

(63) Continuation of application No. 14/211,407, filed on Mar. 14, 2014, now Pat. No. 9,306,254.

(60) Provisional application No. 61/788,675, filed on Mar. 15, 2013.

(51) Int. Cl.
| | |
|---|---|
| *H05K 7/00* | (2006.01) |
| *H05K 7/02* | (2006.01) |
| *H01P 1/04* | (2006.01) |
| *H01P 3/06* | (2006.01) |
| *H01P 5/12* | (2006.01) |

(52) U.S. Cl.
CPC ............. *H05K 7/005* (2013.01); *H01P 1/045* (2013.01); *H01P 3/06* (2013.01); *H01P 5/12* (2013.01); *H05K 7/02* (2013.01); *H05K 7/026* (2013.01)

(58) Field of Classification Search
CPC .. H01P 3/06; H01P 1/042; H01P 1/045; H01P 3/12; H05K 7/02; H05K 7/026; H05K 7/005
USPC ........................................ 333/243, 245, 260
See application file for complete search history.

(56) References Cited

U.S. PATENT DOCUMENTS

| | | |
|---|---|---|
| 2,743,505 A | 5/1956 | George |
| 2,812,501 A | 11/1957 | Sommers |
| 2,914,766 A | 11/1959 | Butler |
| 2,997,519 A | 8/1961 | Hines |
| 3,517,847 A | 11/1964 | Williams |

(Continued)

FOREIGN PATENT DOCUMENTS

| | | |
|---|---|---|
| CA | 2055116 A1 | 5/1992 |
| DE | 3623093 A1 | 1/1988 |

(Continued)

OTHER PUBLICATIONS

"Multiplexer/LNA Module using PolyStrata®," GOMACTech-15, Mar. 26, 2015.

(Continued)

*Primary Examiner* — Benny Lee
*Assistant Examiner* — Hafizur Rahman
(74) *Attorney, Agent, or Firm* — Niels Haun

(57) ABSTRACT

Substrate-free mechanical structural systems comprised of interconnected subsystems of electronic and/or electromechanical components are provided.

20 Claims, 14 Drawing Sheets

(56) References Cited

U.S. PATENT DOCUMENTS

| | | |
|---|---|---|
| 3,309,632 A | 3/1967 | Trudeau |
| 3,311,966 A | 4/1967 | Henry |
| 3,335,489 A | 8/1967 | Grant |
| 3,352,730 A | 11/1967 | Murch |
| 3,464,855 A | 9/1969 | Quintana |
| 3,526,867 A | 9/1970 | Keeler |
| 3,537,043 A | 10/1970 | Smith |
| 3,560,896 A | 2/1971 | Essinger |
| 3,577,105 A | 5/1971 | Jones, Jr. |
| 3,598,107 A | 8/1971 | Ishikawa |
| 3,760,306 A | 9/1973 | Spinner |
| 3,775,844 A | 12/1973 | Parks |
| 3,789,129 A | 1/1974 | Ditscheid |
| 3,791,858 A | 2/1974 | McPherson |
| 3,884,549 A | 5/1975 | Wang |
| 3,925,883 A | 12/1975 | Cavalear |
| 3,963,999 A | 6/1976 | Nakajima |
| 4,021,789 A | 5/1977 | Furman |
| 4,033,656 A | 7/1977 | Freehauf |
| 4,075,757 A | 2/1978 | Maim |
| 4,275,944 A | 6/1981 | Sochor |
| 4,348,253 A | 9/1982 | Subbarao |
| 4,365,222 A | 12/1982 | Lampert |
| 4,414,424 A | 11/1983 | Mizoguchi |
| 4,417,393 A | 11/1983 | Becker |
| 4,437,074 A | 3/1984 | Cohen |
| 4,521,755 A | 6/1985 | Carlson |
| 4,539,534 A | 9/1985 | Hudspeth |
| 4,581,301 A | 4/1986 | Michaelson |
| 4,591,411 A | 5/1986 | Reimann |
| 4,641,140 A | 2/1987 | Heckaman |
| 4,647,878 A | 3/1987 | Landis |
| 4,663,497 A | 5/1987 | Reimann |
| 4,673,904 A | 6/1987 | Landis |
| 4,684,181 A | 8/1987 | Massit |
| 4,700,159 A | 10/1987 | Jones |
| 4,717,064 A | 1/1988 | Popielarski |
| 4,729,510 A | 3/1988 | Landis |
| 4,771,294 A | 9/1988 | Wasilousky |
| 4,808,273 A | 2/1989 | Hua |
| 4,832,461 A | 5/1989 | Yamagishi |
| 4,853,656 A | 8/1989 | Guillou |
| 4,856,184 A | 8/1989 | Doeling |
| 4,857,418 A | 8/1989 | Schuetz |
| 4,859,806 A | 8/1989 | Smith |
| 4,876,322 A | 10/1989 | Budde |
| 4,880,684 A | 11/1989 | Boss |
| 4,909,909 A | 3/1990 | Florjancic |
| 4,915,983 A | 4/1990 | Lake |
| 4,969,979 A | 11/1990 | Appelt |
| 4,975,142 A | 12/1990 | Iannacone |
| 5,069,749 A | 12/1991 | Gutierrez |
| 5,072,201 A | 12/1991 | Devaux |
| 5,089,880 A | 2/1992 | Meyer |
| 5,100,501 A | 3/1992 | Blumenthal |
| 5,119,049 A | 6/1992 | Heller |
| 5,191,699 A | 3/1993 | Ganslmeier |
| 5,213,511 A | 5/1993 | Sobhani |
| 5,227,013 A | 7/1993 | Kumar |
| 5,235,208 A | 8/1993 | Katoh |
| 5,274,484 A | 12/1993 | Mochizuki |
| 5,299,939 A | 4/1994 | Walker |
| 5,312,456 A | 5/1994 | Reed |
| 5,334,956 A | 8/1994 | Leding |
| 5,381,157 A | 1/1995 | Shiga |
| 5,406,235 A | 4/1995 | Hayashi |
| 5,406,423 A | 4/1995 | Hayashi |
| 5,430,257 A | 7/1995 | Lau |
| 5,454,161 A | 10/1995 | Beilin |
| 5,529,504 A | 6/1996 | Greenstein |
| 5,622,895 A | 4/1997 | Frank |
| 5,633,615 A | 5/1997 | Quan |
| 5,682,062 A | 10/1997 | Gaul |
| 5,682,124 A | 10/1997 | Suski |
| 5,712,607 A | 1/1998 | Dittmer |
| 5,724,012 A | 3/1998 | Teunisse |
| 5,746,868 A | 5/1998 | Abe |
| 5,793,272 A | 8/1998 | Burghartz |
| 5,814,889 A | 9/1998 | Gaul |
| 5,860,812 A | 1/1999 | Gugliotti |
| 5,872,399 A | 2/1999 | Lee |
| 5,903,059 A | 5/1999 | Bertin |
| 5,925,206 A | 7/1999 | Boyko |
| 5,940,674 A | 8/1999 | Sachs |
| 5,961,347 A | 10/1999 | Hsu |
| 5,977,842 A | 11/1999 | Brown |
| 5,990,768 A | 11/1999 | Takahashi |
| 6,008,102 A | 12/1999 | Alford |
| 6,027,630 A | 2/2000 | Cohen |
| 6,054,252 A | 4/2000 | Lundy |
| 6,180,261 B1 | 1/2001 | Inoue |
| 6,183,268 B1 | 2/2001 | Consoli |
| 6,207,901 B1 | 3/2001 | Smith |
| 6,210,221 B1 | 4/2001 | Maury |
| 6,228,466 B1 | 5/2001 | Tsukada |
| 6,232,669 B1 | 5/2001 | Khoury |
| 6,294,965 B1 | 9/2001 | Merrill |
| 6,329,605 B1 | 12/2001 | Beroz |
| 6,350,633 B1 | 2/2002 | Lin |
| 6,388,198 B1 | 5/2002 | Bertin |
| 6,457,979 B1 | 10/2002 | Dove |
| 6,465,747 B2 | 10/2002 | DiStefano |
| 6,466,112 B1 | 10/2002 | Kwon |
| 6,514,845 B1 | 2/2003 | Eng |
| 6,518,165 B1 | 2/2003 | Yoon |
| 6,535,088 B1 | 3/2003 | Sherman |
| 6,589,594 B1 | 7/2003 | Hembree |
| 6,600,395 B1 | 7/2003 | Handforth |
| 6,603,376 B1 | 8/2003 | Handforth |
| 6,648,653 B2 | 11/2003 | Huang |
| 6,662,443 B2 | 12/2003 | Chou |
| 6,677,248 B2 | 1/2004 | Kwon |
| 6,735,009 B2 | 5/2004 | Li |
| 6,746,891 B2 | 6/2004 | Cunningham |
| 6,749,737 B2 | 6/2004 | Cheng |
| 6,800,360 B2 | 10/2004 | Miyanaga |
| 6,800,555 B2 | 10/2004 | Test |
| 6,827,608 B2 | 12/2004 | Hall |
| 6,850,084 B2 | 2/2005 | Hembree |
| 6,888,427 B2 | 5/2005 | Sinsheimer |
| 6,889,433 B1 | 5/2005 | Enomoto |
| 6,914,513 B1 | 7/2005 | Wahlers |
| 6,917,086 B2 | 7/2005 | Cunningham |
| 6,943,452 B2 | 9/2005 | Bertin |
| 6,971,913 B1 | 12/2005 | Chu |
| 6,975,267 B2 | 12/2005 | Stenger |
| 6,981,414 B2 | 1/2006 | Knowles |
| 7,005,750 B2 | 2/2006 | Liu |
| 7,012,489 B2 | 3/2006 | Sherrer |
| 7,030,712 B2 | 4/2006 | Brunette |
| 7,064,449 B2 | 6/2006 | Lin |
| 7,077,697 B2 | 7/2006 | Kooiman |
| 7,084,722 B2 | 8/2006 | Goyette |
| D530,674 S | 10/2006 | Ko |
| 7,116,190 B2 * | 10/2006 | Brunker ............. H01P 3/023 333/1 |
| 7,129,163 B2 | 10/2006 | Sherrer |
| 7,148,141 B2 | 12/2006 | Shim |
| 7,148,722 B1 | 12/2006 | Cliff |
| 7,148,772 B2 | 12/2006 | Sherrer |
| 7,165,974 B2 | 1/2007 | Kooiman |
| 7,217,156 B2 | 5/2007 | Wang |
| 7,222,420 B2 | 5/2007 | Moriizumi |
| 7,239,219 B2 | 7/2007 | Brown |
| 7,252,861 B2 | 8/2007 | Smalley |
| 7,259,640 B2 | 8/2007 | Brown |
| 7,383,632 B2 | 6/2008 | Dittmann |
| 7,388,388 B2 | 6/2008 | Dong |
| 7,400,222 B2 | 7/2008 | Kwon |
| 7,405,638 B2 | 7/2008 | Sherrer |
| 7,449,784 B2 | 11/2008 | Sherrer |
| 7,478,475 B2 | 1/2009 | Hall |
| 7,508,065 B2 | 3/2009 | Sherrer |
| 7,532,163 B2 | 5/2009 | Chang |

(56) References Cited

U.S. PATENT DOCUMENTS

| | | |
|---|---|---|
| 7,555,309 B2 | 6/2009 | Baldor |
| 7,575,474 B1 | 8/2009 | Dodson |
| 7,579,553 B2 | 8/2009 | Moriizumi |
| 7,602,059 B2 | 10/2009 | Nobutaka |
| 7,619,441 B1 | 11/2009 | Rahman |
| 7,628,617 B2 | 12/2009 | Brown |
| 7,645,147 B2 | 1/2010 | Dittmann |
| 7,645,940 B2 | 1/2010 | Shepherd |
| 7,649,432 B2 | 1/2010 | Sherrer |
| 7,656,256 B2 | 2/2010 | Houck |
| 7,658,831 B2 | 2/2010 | Mathieu |
| 7,683,842 B1 | 3/2010 | Engel |
| 7,705,456 B2 | 4/2010 | Hu |
| 7,755,174 B2 | 7/2010 | Rollin |
| 7,898,356 B2 | 3/2011 | Sherrer |
| 7,948,335 B2 | 5/2011 | Sherrer |
| 8,011,959 B1 | 9/2011 | Tsai |
| 8,031,037 B2 | 10/2011 | Sherrer |
| 8,188,932 B2 | 5/2012 | Worl |
| 8,264,297 B2 | 9/2012 | Thompson |
| 8,304,666 B2 | 11/2012 | Ko |
| 8,339,232 B2 | 12/2012 | Lotfi |
| 8,441,118 B2 | 5/2013 | Hua |
| 8,522,430 B2 | 9/2013 | Kacker |
| 8,542,079 B2 | 9/2013 | Sherrer |
| 8,641,428 B2 | 2/2014 | Light |
| 8,674,872 B2 | 3/2014 | Billaud |
| 8,742,874 B2 | 6/2014 | Sherrer |
| 8,814,601 B1 | 8/2014 | Sherrer |
| 8,888,504 B2 | 11/2014 | Pischler |
| 9,000,863 B2 | 4/2015 | Sherrer |
| 9,306,254 B1 * | 4/2016 | Hovey ..................... H01P 3/06 |
| 9,325,044 B2 | 4/2016 | Reid |
| 9,583,856 B2 | 2/2017 | Sherrer |
| 9,633,976 B1 | 4/2017 | Bernstein |
| 2001/0040051 A1 | 11/2001 | Lipponen |
| 2001/0045361 A1 | 11/2001 | Boone |
| 2002/0075104 A1 | 6/2002 | Kwon |
| 2002/0127768 A1 | 9/2002 | Badir |
| 2003/0029729 A1 | 2/2003 | Cheng |
| 2003/0052755 A1 | 3/2003 | Barnes |
| 2003/0117237 A1 | 6/2003 | Niu |
| 2003/0221968 A1 | 12/2003 | Cohen |
| 2003/0222738 A1 | 12/2003 | Brown |
| 2004/0000701 A1 | 1/2004 | White |
| 2004/0003524 A1 | 1/2004 | Ha |
| 2004/0004061 A1 | 1/2004 | Merdan |
| 2004/0007468 A1 | 1/2004 | Cohen |
| 2004/0007470 A1 | 1/2004 | Smalley |
| 2004/0038586 A1 | 2/2004 | Hall |
| 2004/0076806 A1 | 4/2004 | Miyanaga |
| 2004/0124961 A1 | 7/2004 | Aoyagi |
| 2004/0196112 A1 | 10/2004 | Welbon |
| 2004/0263290 A1 | 12/2004 | Sherrer |
| 2005/0030124 A1 | 2/2005 | Okamoto |
| 2005/0042932 A1 | 2/2005 | Mok |
| 2005/0045484 A1 | 3/2005 | Smalley |
| 2005/0156693 A1 | 7/2005 | Dove |
| 2005/0230145 A1 | 10/2005 | Ishii |
| 2005/0250253 A1 | 11/2005 | Cheung |
| 2008/0191817 A1 | 8/2008 | Sherrer |
| 2008/0197946 A1 | 8/2008 | Houck |
| 2008/0199656 A1 | 8/2008 | Nichols |
| 2008/0240656 A1 | 10/2008 | Rollin |
| 2009/0004385 A1 | 1/2009 | Blackwell |
| 2009/0051476 A1 | 2/2009 | Tada |
| 2009/0154972 A1 | 6/2009 | Tanaka |
| 2010/0007016 A1 | 1/2010 | Oppermann |
| 2010/0015850 A1 | 1/2010 | Stein |
| 2010/0109819 A1 | 5/2010 | Houck |
| 2010/0225435 A1 | 9/2010 | Li |
| 2010/0296252 A1 | 11/2010 | Rollin |
| 2010/0323551 A1 | 12/2010 | Eldridge |
| 2011/0123783 A1 | 5/2011 | Sherrer |
| 2011/0123794 A1 | 5/2011 | Hiller |
| 2011/0181376 A1 | 7/2011 | Vanhille |
| 2011/0181377 A1 | 7/2011 | Vanhille |
| 2011/0210807 A1 | 9/2011 | Sherrer |
| 2011/0273241 A1 | 11/2011 | Sherrer |
| 2012/0233849 A1 | 9/2012 | Smeys |
| 2013/0050055 A1 | 2/2013 | Paradiso |
| 2013/0127577 A1 | 5/2013 | Lotfi |
| 2016/0054385 A1 | 2/2016 | Suto |

FOREIGN PATENT DOCUMENTS

| | | |
|---|---|---|
| EP | 0398019 A1 | 11/1990 |
| EP | 0485831 A1 | 5/1992 |
| EP | 0845831 A2 | 6/1998 |
| EP | 0911903 A2 | 4/1999 |
| FR | 2086327 A1 | 12/1971 |
| GB | 2265754 | 10/1993 |
| JP | H027587 A | 1/1990 |
| JP | 3027587 | 2/1991 |
| JP | H041710 A | 1/1992 |
| JP | H0685510 A | 3/1994 |
| JP | H06302964 A | 10/1994 |
| JP | H07060844 | 3/1995 |
| JP | H07235803 | 9/1995 |
| JP | H10041710 | 2/1998 |
| JP | 1998163711 | 6/1998 |
| JP | 2002533954 | 10/2002 |
| JP | 2003249731 | 9/2003 |
| JP | 200667621 | 3/2006 |
| JP | 2007253354 | 10/2007 |
| JP | 2008211159 | 9/2008 |
| JP | 2008306701 | 12/2008 |
| TW | I244799 | 12/2005 |
| WO | 0007218 A2 | 2/2000 |
| WO | 0039854 A1 | 7/2000 |
| WO | 0206152 A2 | 1/2002 |
| WO | 02080279 A1 | 10/2002 |
| WO | 2004000406 A1 | 12/2003 |
| WO | 2004004061 | 1/2004 |
| WO | 2005112105 | 11/2005 |
| WO | 2009013751 A2 | 1/2009 |
| WO | 2010111455 | 9/2010 |

OTHER PUBLICATIONS

A. Boryssenko, J. Arroyo, R. Reid, M.S. Heimbeck, "Substrate free G-band Vivaldi antenna array design, fabrication and testing" 2014 IEEE International Conference on Infrared, Millimeter, and Terahertz Waves, Tucson, Sep. 2014.

A. Boryssenko, K. Vanhille, "300-GHz microfabricated waveguide slotted arrays" 2014 IEEE International Conference on Infrared, Millimeter, and Terahertz Waves, Tucson, Sep. 2014.

A.A. Immorlica Jr., R. Actis, D. Nair, K. Vanhille, C. Nichols, J.-M. Rollin, D. Fleming, R. Varghese, D. Sherrer, D. Filipovic, E. Cullens, N. Ehsan, and Z. Popovic, "Miniature 3D micromachined solid state amplifiers," in 2008 IEEE International Conference on Microwaves, Communications, Antennas, and Electronics Systems, Tel-Aviv, Israel, May 2008, pp. 1-7.

Ali Darwish et al.; Vertical Balun and Wilkinson Divider; 2002 IEEE MTT-S Digest; pp. 109-112. NPL_30.

B. Cannon, K. Vanhille, "Microfabricated Dual-Polarized, W-band Antenna Architecture for Scalable Line Array Feed," 2015 IEEE Antenna and Propagation Symposium, Vancouver, Canada, Jul. 2015.

Brown et al., 'A Low-Loss Ka-Band Filter in Rectangular Coax Made by Electrochemical Fabrication', submitted to Microwave and Wireless Components Letters, date unknown {downloaded from www.memgen.com, 2004). NPL_1.

Chance, G.I. et al., "A suspended-membrane balanced frequency doubler at 200GHz," 29th International Conference on Infrared and Millimeter Waves and Terahertz Electronics, pp. 321-322, Karlsrube, 2004.

Chwomnawang et al., 'On-chip 3D Air Core Micro-Inductor for High-Frequency Applications Using Deformation of Sacrificial Polymer', Proc. SPIE, vol. 4334, pp. 54-62, Mar. 2001. NPL_2.

(56) References Cited

OTHER PUBLICATIONS

Colantonio, P., et al., "High Efficiency RF and Microwave Solid State Power Amplifiers," pp. 380-395, 2009.
Cole, B.E., et al., Micromachined Pixel Arrays Integrated with CMOS for Infrared Applications, pp. 64-64 (2000). NPL_3.
D. Filipovic, G. Potvin, D. Fontaine, C. Nichols, Z. Popovic, S. Rondineau, M. Lukic, K. Vanhille, Y. Saito, D. Sherrer, W. Wilkins, E. Daniels, E. Adler, and J. Evans, "Integrated micro-coaxial Ka-band antenna and array," GomacTech 2007 Conference, Mar. 2007.
D. Filipovic, G. Potvin, D. Fontaine, Y. Saito, J.-M. Rollin, Z. Popovic, M. Lukic, K. Vanhille, C. Nichols, "μ-coaxial phased arrays for Ka-Band Communications," Antenna Applications Symposium, Monticello, IL, Sep. 2008, pp. 104-115.
D. Filipovic, Z. Popovic, K. Vanhille, M. Lukic, S. Rondineau, M. Buck, G. Potvin, D. Fontaine, C. Nichols, D. Sherrer, S. Zhou, W. Houck, D. Fleming, E. Daniel, W. Wilkins, V. Sokolov, E. Adler, and J. Evans, "Quasi-planar rectangular ¼-coaxial structures for mm-wave applications," Proc. GomacTech., pp. 28-31, San Diego, Mar. 2006.
D. Sherrer, "Improving electronics\ functional density," MICROmanufacturing, May/Jun. 2015, pp. 16-18.
D.S. Filipovic, M. Lukic, Y. Lee and D. Fontaine, "Monolithic rectangular coaxial lines and resonators with embedded dielectric support," IEEE Microwave and Wireless Components Letters, vol. 18, No. 11, pp. 740-742, 2008.
De Los Santos, H.J., Introduction to Microelectromechanical (MEM) Microwave Systems {pp. 4, 7-8, 13) (1999). NPL_4.
Deyong, C, et al., A Microstructure Semiconductor Thermocouple for Microwave Power Sensors, 1997 Asia Pacific Microwave Conference, pp. 917-919. NPL_5.
E. Cullens, "Microfabricated Broadband Components for Microwave Front Ends," Thesis, 2011.
E. Cullens, K. Vanhille, Z. Popovic, "Miniature bias-tee networks integrated in microcoaxial lines," in Proc. 40th European Microwave Conf., Paris, France, Sep. 2010, pp. 413-416.
E. Cullens, L. Ranzani, E. Grossman, Z. Popovic, "G-Band Frequency Steering Antenna Array Design and Measurements," Proceedings of the XXXth URSI General Assembly, Istanbul, Turkey, Aug. 2011.
E. Cullens, L. Ranzani, K. Vanhille, E. Grossman, N. Ehsan, Z. Popovic, "Micro-Fabricated 130-180 GHz frequency scanning waveguide arrays," IEEE Trans. Antennas Propag., Aug. 2012, vol. 60, No. 8, pp. 3647-3653.
Ehsan, N., "Broadband Microwave Litographic 3D Components," Dissertation 2009.
Ehsan, N. et al., "Microcoaxial lines for active hybrid-monolithic circuits," 2009 IEEE MTT-S Int. Microwave.Symp. Boston, MA, Jun. 2009.
Elliott Brown/MEMGen Corporation, 'RF Applications of EFAB Technology', MTT-S IMS 2003, pp. 1-15. NPL_6.
Engelmann et al., 'Fabrication of High Depth-to-Width Aspect Ratio Microstructures', IEEE Micro Electro Mechanical Systems (Feb. 1992), pp. 93-98.
European Examination Report dated Mar. 21, 2013 for EP Application No. 07150463.3.
European Examination Report of corresponding European Patent Application No. 08 15 3144 dated Apr. 6, 2010.
European Examination Report of corresponding European Patent Application No. 08 15 3144 dated Feb. 22, 2012.
European Examination Report of corresponding European Patent Application No. 08 15 3144 dated Nov. 10, 2008.
European Examination Report of EP App. No. 07150463.3 dated Feb. 16, 2015.
European Search Report for corresponding EP Application No. 07150463.3 dated Apr. 23, 2012.
European Search Report of Corresponding European Application No. 07 15 0467 dated Apr. 28, 2008.
European Search Report of corresponding European Application No. 08 15 3138 dated Jul. 15, 2008.
European Search Report of corresponding European Patent Application No. 08 15 3144 dated Jul. 2, 2008.
Filipovic, D. et al., "Monolithic rectangular coaxial lines. Components and systems for commercial and defense applications," Presented at 2008 IASTED Antennas, Radar, and Wave Propagation Conferences, Baltimore, MD, USA, Apr. 2008.
Filipovic, D.S., "Design of microfabricated rectangular coaxial lines and components for mm-wave applications," Microwave Review, vol. 12, No. 2, Nov. 2006, pp. 11-16.
Filipovic et al.; 'Modeling, Design, Fabrication, and Performance of Rectangular .mu.-Coaxial Lines and Components'; Microwave Symposium Digest, 2006, IEEE; Jun. 1, 2006; pp. 1393-1396.
Franssila, S., Introduction to Microfabrication, (pp. 8) (2004). NPL_7.
Frazier et al., 'M ET ALlic Microstructures Fabricated Using Photosensitive Polyimide Electroplating Molds', Journal of Microelectromechanical Systems, vol. 2, No. 2, Jun. 1993, pp. 87-94. NPL_8.
Ghodisian, B., et al., Fabrication of Affordable M ET ALLic Microstructures by Electroplating and Photoresist Molds, 1996, pp. 68-71. NPL_9.
H. Guckel, 'High-Aspect-Ratio Micromachining Via Deep X-Ray Lithography', Proc. Of IEEE, vol. 86, No. 8 (Aug. 1998), pp. 1586-1593. NPL_10.
H. Kazemi, "350mW G-band Medium Power Amplifier Fabricated Through a New Method of 3D-Copper Additive Manufacturing," IEEE 2015.
H. Kazemi, "Ultra-compact G-band 16way Power Splitter/Combiner Module Fabricated Through a New Method of 3D-Copper Additive Manufacturing," IEEE 2015.
H. Zhou, N. A. Sutton, D. S. Filipovic, "Surface micromachined millimeter-wave log-periodic dipole array antennas," IEEE Trans. Antennas Propag., Oct. 2012, vol. 60, No. 10, pp. 4573-4581.
H. Zhou, N. A. Sutton, D. S. Filipovic, "Wideband W-band patch antenna," 5th European Conference on Antennas and Propagation , Rome, Italy, Apr. 2011, pp. 1518-1521.
H. Zhou, N.A. Sutton, D. S. Filipovic, "W-band endfire log periodic dipole array," Proc. IEEE-APS/URSI Symposium, Spokane, WA, Jul. 2011, pp. 1233-1236.
Hawkins, C.F., The Microelectronics Failure Analysis, Desk Reference Edition (2004). NPL_11.
Horton, M.C., et al., "The Digital Elliptic Filter—A Compact Sharp-Cutoff Design for Wide Bandstop or Bandpass Requirements," IEEE Transactions on Microwave Theory and Techniques, (1967) MTT-15:307-314.
Immorlica, Jr., T. et al., "Miniature 3D micro-machined solid state power amplifiers," COMCAS 2008.
Ingram, D.L. et al., "A 427 mW 20% compact W-band InP HEMT MMIC power amplifier," IEEE RFIC Symp. Digest 1999, pp. 95-98.
International Preliminary Report on Patentability dated Jul. 24, 2012 for corresponding PCT/US2011/022173.
International Preliminary Report on Patentability dated May 19, 2006 on corresponding PCT/US04/06665.
International Search Report corresponding to PCT/US12/46734 dated Nov. 20, 2012.
International Search Report dated Aug. 29, 2005 on corresponding PCT/US04/06665.
J. M. Oliver, J.-M. Rollin, K. Vanhille, S. Raman, "A W-band micromachined 3-D cavity-backed patch antenna array with integrated diode detector," IEEE Trans. Microwave Theory Tech., Feb. 2012, vol. 60, No. 2, pp. 284-292.
J. M. Oliver, P. E. Ralston, E. Cullens, L. M. Ranzani, S. Raman, K. Vanhille, "A W-band Micro-coaxial Passive Monopulse Comparator Network with Integrated Cavity-Backed Patch Antenna Array," 2011 IEEE MTT-S Int. Microwave, Symp., Baltimore, MD, Jun. 2011.
J. Mruk, "Wideband Monolithically Integrated Front-End Subsystems and Components," Thesis, 2011.
J. Mruk, Z. Hongyu, M. Uhm, Y. Saito, D. Filipovic, "Wideband mm-Wave Log-Periodic Antennas," 3rd European Conference on Antennas and Propagation, pp. 2284-2287, Mar. 2009.

(56) References Cited

OTHER PUBLICATIONS

J. Oliver, "3D Micromachined Passive Components and Active Circuit Integration for Millimeter-Wave Radar Applications," Thesis, Feb. 10, 2011.
J. R. Mruk, H. Zhou, H. Levitt, D. Filipovic, "Dual wideband monolithically integrated millimeter-wave passive front-end subsystems," in 2010 Int. Conf. on Infrared, Millimeter and Terahertz Waves , Sep. 2010, pp. 1-2.
J. R. Mruk, N. Sutton, D. S. Filipovic, "Micro-coaxial fed 18 to 110 GHz planar log-periodic antennas with RF transitions," IEEE Trans. Antennas Propag., vol. 62, No. 2, Feb. 2014, pp. 968-972.
J. Reid, "PolyStrata Millimeter-wave Tunable Filters," GOMACTech-12, Mar. 22, 2012.
J.M. Oliver, H. Kazemi, J.-M. Rollin, D. Sherrer, S. Huettner, S. Raman, "Compact, low-loss, micromachined rectangular coaxial millimeter-wave power combining networks," 2013 IEEE MTT-S Int. Microwave, Symp., Seattle, WA, Jun. 2013.
J.R. Mruk, Y. Saito, K. Kim, M. Radway, D. Filipovic, "A directly fed Ku- to W-band 2-arm Archimedean spiral antenna," Proc. 41st European Microwave Conf., Oct. 2011, pp. 539-542.
J.R. Reid, D. Hanna, R.T. Webster, "A 40/50 GHz diplexer realized with three dimensional copper micromachining," in 2008 IEEE MTT-S Int. Microwave Symp., Atlanta, GA, Jun. 2008, pp. 1271-1274.
J.R. Reid, J.M. Oliver, K. Vanhille, D. Sherrer, "Three dimensional metal micromachining: A disruptive technology for millimeter-wave filters," 2012 IEEE Topical Meeting on Silicon Monolithic Integrated Circuits in RF Systems, Jan. 2012.
Jeong, I., et al., "High Performance Air-Gap Transmission Lines and Inductors for Milimeter-Wave Applications", Transactions on Microwave Theory and Techniques, vol. 50, No. 12, Dec. 2002.
Jeong, Inho et al., 'High-Performance Air-Gap Transmission Lines and Inductors for Millimeter-Wave Applications', IEEE Transactions on Microwave Theory and Techniques, Dec. 2002, pp. 2850-2855, vol. 50, No. 12. NPL_12.
K. J. Vanhille, D. L. Fontaine, C. Nichols, D. S. Filipovic, and Z. Popovic, "Quasi-planar high-Q millimeter-wave resonators," IEEE Trans. Microwave Theory Tech., vol. 54, No. 6, pp. 2439-2446, Jun. 2006.
K. M. Lambert, F. A. Miranda, R. R. Romanofsky, T. E. Durham, K. J. Vanhille, "Antenna characterization for the Wideband Instrument for Snow Measurements (WISM)," 2015 IEEE Antenna and Propagation Symposium, Vancouver, Canada, Jul. 2015.
K. Vanhille, "Design and Characterization of Microfabricated Three-Dimensional Millimeter-Wave Components," Thesis, 2007.
K. Vanhille, M. Buck, Z. Popovic, and D.S. Filipovic, "Miniature Ka-band recta-coax components: analysis and design," presented at 2005 AP-S/URSI Symposium, Washington, DC, Jul. 2005.
K. Vanhille, M. Lukic, S. Rondineau, D. Filipovic, and Z. Popovic, "Integrated micro-coaxial passive components for millimeter-wave antenna front ends," 2007 Antennas, Radar, and Wave Propagation Conference, May 2007.
K. Vanhille, T. Durham, W. Stacy, D. Karasiewicz, A. Caba, C. Trent, K. Lambert, F. Miranda, "A microfabricated 8-40 GHz dual-polarized reflector feed," 2014 Antenna Applications Symposium, Monticello, IL, Sep. 2014. pp. 241-257.
Katehi et al., 'MEMS and Si Micromachined Circuits for High-Frequency Applications', IEEE Transactions on Microwave Theory and Techniques, vol. 50, No. 3, Mar. 2002, pp. 858-866. NPL_13.
Kenneth J. Vanhille et al.; Micro-Coaxial Imedance Transformers; Journal of Latex Class Files; vol. 6; No. 1; Jan. 2007. NPL_29.
Kwok, P.Y., et al., Fluid Effects in Vibrating Micromachined Structures, Journal of Microelectromechanical Systems, vol. 14, No. 4, Aug. 2005, pp. 770-781. NPL_14.
L. Ranzani, D. Kuester, K. J. Vanhille, A Boryssenko, E. Grossman, Z. Popovic, "G-Band micro-fabricated frequency-steered arrays with 2°/GHz beam steering," IEEE Trans. on Terahertz Science and Technology, vol. 3, No. 5, Sep. 2013.
L. Ranzani, E. D. Cullens, D. Kuester, K. J. Vanhille, E. Grossman, Z. Popovic, "W-band micro-fabricated coaxially-fed frequency scanned slot arrays," IEEE Trans. Antennas Propag., vol. 61, No. 4, Apr. 2013.
L. Ranzani, I. Ramos, Z. Popovic, D. Maksimovic, "Microfabricated transmission-line transformers with DC isolation," URSI National Radio Science Meeting, Boulder, CO, Jan. 2014.
L. Ranzani, N. Ehsan, Z. Popovi‡, "G-band frequency-scanned antenna arrays," 2010 IEEE APS-URSI International Symposium, Toronto, Canada, Jul. 2010.
Lee et al., 'Micromachining Applications of a High Resolution Ultrathick Photoresist', J. Vac. Sci. Technol. B 13 (6), Nov./Dec. 1995, pp. 3012-3016. NPL_15.
Loechel et al., 'Application of Ultraviolet Depth Lithography for Surface Micromachining', J. Vac. Sci. Technol. B 13 (6), Nov./Dec. 1995, pp. 2934-2939. NPL_16.
Lukic, M. et al., "Surface-micromachined dual Ka-band cavity backed patch antennas," IEE Trans. AtennasPropag., vol. 55, pp. 2107-2110, Jul. 2007.
M. Lukic, D. Filipovic, "Modeling of surface roughness effects on the performance of rectangular µ-coaxial lines," Proc. 22nd Ann. Rev. Prog. Applied Comp. Electromag. (ACES), pp. 620-625, Miami, Mar. 2006.
M. Lukic, D. Fontaine, C. Nichols, D. Filipovic, "Surface micromachined Ka-band phased array antenna," Presented at Antenna Applic. Symposium, Monticello, IL, Sep. 2006.
M. Lukic, K. Kim, Y. Lee, Y. Saito, and D. S. Filipovic, "Multiphysics design and performance of a surface micromachined Ka-band cavity backed patch antenna," 2007 SBMO/IEEE Int. Microwave and Optoelectronics Conf., Oct. 2007, pp. 321-324.
M. Lukic, S. Rondineau, Z. Popovic, D. Filipovic, "Modeling of realistic rectangular µ-coaxial lines," IEEE Trans. Microwave Theory Tech., vol. 54, No. 5, pp. 2068-2076, May 2006.
M. V. Lukic, and D. S. Filipovic, "Integrated cavity-backed ka-band phased array antenna," Proc. IEEE-APS/URSI Symposium, Jun. 2007, pp. 133-135.
M. V. Lukic, and D. S. Filipovic, "Modeling of 3-D Surface Roughness Effects With Application to µ-Coaxial Lines," IEEE Trans. Microwave Theory Tech., Mar. 2007, pp. 518-525.
M. V. Lukic, and D. S. Filipovic, "Surface-micromachined dual Ka-and cavity backed patch antenna," IEEE Trans. Antennas Propag., vol. 55, No. 7, pp. 2107-2110, Jul. 2007.
Madou, M.J., Fundamentals of Microfabrication: The Science of Miniaturization, 2d Ed., 2002 (Roadmap; pp. 615-668). NPL_17.
Mruk, J.R., Filipovic, D.S, "Micro-coaxial V-/W-band filters and contiguous diplexers," Microwaves, Antennas & Propagation, IET, Jul. 17, 2012, vol. 6, issue 10, pp. 1142-1148.
Mruk, J.R., Saito, Y., Kim, K., Radway, M., Filipovic, D.S., "Directly fed millimetre-wave two-arm spiral antenna," Electronics Letters, Nov. 25, 2010, vol. 46 , issue 24, pp. 1585-1587.
N. Chamberlain, M. Sanchez Barbetty, G. Sadowy, E. Long, K. Vanhille, "A dual-polarized metal patch antenna element for phased array applications," 2014 IEEE Antenna and Propagation Symposium, Memphis, Jul. 2014. pp. 1640-1641.
N. Ehsan, "Broadband Microwave Lithographic 3D Components," Thesis, 2009.
N. Ehsan, K. Vanhille, S. Rondineau, E. Cullens, Z. Popovic, "Broadband Wilkinson Dividers," IEEE Trans. Microwave Theory Tech., Nov. 2009, pp. 2783-2789.
N. Ehsan, K.J. Vanhille, S. Rondineau, Z. Popovic, "Micro-coaxial impedance transformers," IEEE Trans. Microwave Theory Tech., Nov. 2010, pp. 2908-2914.
N. Jastram, "Design of a Wideband Millimeter Wave Micromachined Rotman Lens," IEEE Transactions on Antennas and Propagation, vol. 63, No. 6, Jun. 2015.
N. Jastram, "Wideband Millimeter-Wave Surface Micromachined Tapered Slot Antenna," IEEE Antennas and Wireless Propagation Letters, vol. 13, 2014.
N. Jastram, "Wideband Multibeam Millimeter Wave Arrays," IEEE 2014.

(56) References Cited

OTHER PUBLICATIONS

N. Jastram, D. Filipovic, "Monolithically integrated K/Ka array-based direction finding subsystem," Proc. IEEE-APS/URSI Symposium, Chicago, IL, Jul. 2012, pp. 1-2.
N. Jastram, D. S. Filipovic, "Parameter study and design of W-band micromachined tapered slot antenna," Proc. IEEE-APS/URSI Symposium, Orlando, FL, Jul. 2013, pp. 434-435.
N. Jastram, D. S. Filipovic, "PCB-based prototyping of 3-D micromachined RF subsystems," IEEE Trans. Antennas Propag., vol. 62, No. 1, Jan. 2014. pp. 420-429.
N. Sutton, D.S. Filipovic, "Design of a K- thru Ka-band modified Butler matrix feed for a 4-arm spiral antenna," 2010 Loughborough Antennas and Propagation Conference, Loughborough, UK, Nov. 2010, pp. 521-524.
N.A. Sutton, D. S. Filipovic, "V-band monolithically integrated four-arm spiral antenna and beamforming network," Proc. IEEE-APS/URSI Symposium, Chicago, IL, Jul. 2012, pp. 1-2.
N.A. Sutton, J. M. Oliver, D. S. Filipovic, "Wideband 15-50 GHz symmetric multi-section coupled line quadrature hybrid based on surface micromachining technology," 2012 IEEE MTT-S Int. Microwave, Symp., Montreal, Canada, Jun. 2012.
N.A. Sutton, J.M. Oliver, D.S. Filipovic, "Wideband 18-40 GHz surface micromachined branchline quadrature hybrid," IEEE Microwave and Wireless Components Letters, Sep. 2012, vol. 22, No. 9, pp. 462-464.
Oliver, J.M. et al., "A 3-D micromachined W-band cavity backed patch antenna array with integrated rectacoax transition to wave guide," 2009 Proc. IEEE International Microwave Symposium, Boston, MA 2009.
P. Ralston, K. Vanhille, A. Caba, M. Oliver, S. Raman, "Test and verification of micro coaxial line power performance," 2012 IEEE MTT-S Int. Microwave, Symp., Montreal, Canada, Jun. 2012.
P. Ralston, M. Oliver, K. Vummidi, S. Raman, "Liquid-metal vertical interconnects for flip chip assembly of GaAs C-band power amplifiers onto micro-rectangular coaxial transmission lines," IEEE Compound Semiconductor Integrated Circuit Symposium, Oct. 2011.
P. Ralston, M. Oliver, K. Vummidi, S. Raman, "Liquid-metal vertical interconnects for flip chip assembly of GaAs C-band power amplifiers onto micro-rectangular coaxial transmission lines," IEEE Journal of Solid-State Circuits, Oct. 2012, vol. 47, No. 10, pp. 2327-2334.
Park et al., 'Electroplated Micro-Inductors and Micro-Transformers for Wireless application', IMAPS 2002, Denver, CO, Sep. 2002. NPL__18.
PwrSoC Update 2012: Technology, Challenges, and Opportunities for Power Supply on Chip, Presentation (Mar. 18, 2013).
Rollin, J.M. et al., "A membrane planar diode for 200GHz mixing applications," 29th International Conference on Infrared and Millimeter Waves and Terahertz Electronics, pp. 205-206, Karlsrube, 2004.
Rollin, J.M. et al., "Integrated Schottky diode for a sub-harmonic mixer at millimetre wavelengths," 31st International Conference on Infrared and Millimeter Waves and Terahertz Electronics, Paris, 2006.
S. Huettner, "High Performance 3D Micro-Coax Technology," Microwave Journal, Nov. 2013. [online: http://www.microwavejournal.com/articles/21004-high-performance-3d-micro-coax-technology].
S. Huettner, "Transmission lines withstand vibration," Microwaves and RF, Mar. 2011. [online: http://mwrf.com/passive-components/transmission-lines-withstand-vibration].
S. Scholl, C. Gorle, F. Houshmand, T. Liu, H. Lee, Y. Won, H. Kazemi, M. Asheghi, K. Goodson, "Numerical Simulation of Advanced Monolithic Microcooler Designs for High Heat Flux Microelectronics," InterPACK, San Francisco, CA, Jul. 2015.
S. Scholl, C. Gorle, F. Houshmand, T. Verstraete, M. Asheghi, K. Goodson, "Optimization of a microchannel geometry for cooling high heat flux microelectronics using numerical methods," InterPACK, San Francisco, CA, Jul. 2015.
Saito, Y., Fontaine, D., Rollin, J-M., Filipovic, D., 'Micro-Coaxial Ka-Band Gysel Power Dividers,' Microwave Opt Technol Lett 52: 474-478, 2010, Feb. 2010.
Saito et al., "Analysis and design of monolithic rectangular coaxial lines for minimum coupling," IEEE Trans. Microwave Theory Tech., vol. 55, pp. 2521-2530, Dec. 2007.
Sedky, S., Post-Processing Techniques for Integrated MEMS (pp. 9, 11, 164) (2006). NPL__19.
Sherrer, D, Vanhille, K, Rollin, J.M., 'PolyStrata Technology: A Disruptive Approach for 3D Microwave Components and Modules,' Presentation (Apr. 23, 2010).
T. Durham, H.P. Marshall, L. Tsang, P. Racette, Q. Bonds, F. Miranda, K. Vanhille, "Wideband sensor technologies for measuring surface snow," Earthzine, Dec. 2013, [online: http://www.earthzine.org/2013/12/02/wideband-sensor-technologies-for-measuring-surface-snow/].
T. E. Durham, C. Trent, K. Vanhille, K. M. Lambert, F. A. Miranda, "Design of an 8-40 GHz Antenna for the Wideband Instrument for Snow Measurements (WISM)," 2015 IEEE Antenna and Propagation Symposium, Vancouver, Canada, Jul. 2015.
T. Liu, F. Houshmand, C. Gorle, S. Scholl, H. Lee, Y. Won, H. Kazemi, K. Vanhille, M. Asheghi, K. Goodson, "Full-Scale Simulation of an Integrated Monolithic Heat Sink for Thermal Management of a High Power Density GaN—SiC Chip," InterPACK/ICNMM, San Francisco, CA, Jul. 2015.
T.E. Durham, "An 8-40GHz Wideband Instrument for Snow Measurements," Earth Science Technology Forum, Pasadena, CA, Jun. 2011.
Tummala et al.; 'Microelectronics Packaging Handbook'; Jan. 1, 1989; XP002477031; pp. 710-714. NPL__31.
Vanhille, K. 'Design and Characterization of Microfabricated Three-Dimensional Millimeter-Wave Components,' Dissertation, 2007.
Vanhille, K. et al., 'Balanced low-loss Ka-band-coaxial hybrids,' IEEE MTT-S Dig., Honolulu, Hawaii, Jun. 2007.
Vanhille, K. et al., "Ka-Band surface mount directional coupler fabricated using micro-rectangular coaxial transmission lines," 2008 Proc. IEEE International Microwave Symposium, 2008.
Vanhille, K.J. et al., "Ka-band miniaturized quasi-planar high-Q resonators," IEEE Trans. Microwave Theory Tech., vol. 55, No. 6, pp. 1272-1279, Jun. 2007.
Vyas R. et al., "Liquid Crystal Polymer (LCP): The ultimate solution for low-cost RF flexible electronics and antennas," Antennas and Propagation Society, International Symposium, p. 1729-1732 (2007).
Wang, H. et al., "Design of a low integrated sub-harmonic mixer at 183GHz using European Schottky diode technology," From Proceedings of the 4th ESA workshop on Millimetre-Wave Technology and Applications, pp. 249-252, Espoo, Finland, Feb. 2006.
Wang, H. et al., "Power-amplifier modules covering 70-113 GHz using MMICs," IEEE Trans Microwave Theory and Tech., vol. 39, pp. 9-16, Jan. 2001.
Written Opinion corresponding to PCT/US12/46734 dated Nov. 20, 2012.
Written Opinion of the International Searching Authority dated Aug. 29, 2005 on corresponding PCT/US04/06665.
Y. Saito, D. Fontaine, J.-M. Rollin, D.S. Filipovic, "Monolithic micro-coaxial power dividers," Electronic Letts., Apr. 2009, pp. 469-470.
Y. Saito, J.R. Mruk, J.-M. Rollin, D.S. Filipovic, "X- through Q-band log-periodic antenna with monolithically integrated u-coaxial impedance transformer/feeder," Electronic Letts. Jul. 2009, pp. 775-776.
Y. Saito, M.V. Lukic, D. Fontaine, J.-M. Rollin, D.S. Filipovic, "Monolithically Integrated Corporate-Fed Cavity-Backed Antennas," IEEE Trans. Antennas Propag., vol. 57, No. 9, Sep. 2009, pp. 2583-2590.
Yeh, J.L., et al., Copper-Encapsulated Silicon Micromachined Structures, Journal of Microelectromechanical Systems, vol. 9, No. 3, Sep. 2000, pp. 281-287. NPL__20.
Yoon et al., '3-D Lithography and M et al Surface Micromachining for RF and Microwave MEMs' IEEE MEMS 2002 Conference, Las Vegas, NV, Jan. 2002, pp. 673-676. NPL__21.

(56) References Cited

OTHER PUBLICATIONS

Yoon et al., 'CMOS-Compatible Surface Micromachined Suspended-Spiral Inductors for Multi-GHz Sillicon RF Ics', IEEE Electron Device Letters, vol. 23, No. 10, Oct. 2002, pp. 591-593. NPL__22.

Yoon et al., 'High-Performance Electroplated Solenoid-Type Integrated Inductor (SI2) for RF Applications Using Simple 3D Surface Micromachining Technology', Int'l Election Devices Meeting, 1998, San Francisco, CA, Dec. 6-9, 1998, pp. 544-547. NPL__23.

Yoon et al., 'High-Performance Three-Dimensional On-Chip Inductors Fabricated by Novel Micromachining Technology for RF MMIC', 1999 IEEE MTT-S Int'l Microwave Symposium Digest, vol. 4, Jun. 13-19, 1999, Anaheim, California, pp. 1523-1526. NPL__24.

Yoon et al., 'Monolithic High-Q Overhang Inductors Fabricated on Silicon and Glass Substrates', International Electron Devices Meeting, Washington D.C. (Dec. 1999), pp. 753-756. NPL__25.

Yoon et al., 'Monolithic Integration of 3-D Electroplated Microstructures with Unlimited Number of Levels Using Planarization with a Sacrificial M ET ALlic Mole (PSMm)', Twelfth IEEE Int'l Conf. on Micro Electro mechanical systems, Orlando Florida, Jan. 1999, pp. 624-629. NPL__26.

Yoon et al., 'Multilevel Microstructure Fabrication Using Single-Step 3D Photolithography and Single-Step Electroplating', Proc. Of SPIE, vol. 3512, (Sep. 1998), pp. 358-366. NPL__27.

Yoon et al., "High-Performance Electroplated Solenoid-Type Integrated Inductor (S12) for RF Applications Using Simple 3D Surface Micromachining Technology", Int'l Election Devices Meeting, 1998, San Francisco, CA, Dec. 6-9, 1998, pp. 544-547.

Z. Popovic, K. Vanhille, N. Ehsan, E. Cullens, Y. Saito, J.-M. Rollin, C. Nichols, D. Sherrer, D. Fontaine, D. Filipovic, "Micro-fabricated micro-coaxial millimeter-wave components," in 2008 Int. Conf. on Infrared, Millimeter and Terahertz Waves, Pasadena, CA, Sep. 2008, pp. 1-3.

Z. Popovic, S. Rondineau, D. Filipovic, D. Sherrer, C. Nichols, J.-M. Rollin, and K. Vanhille, "An enabling new 3D architecture for microwave components and systems," Microwave Journal, Feb. 2008, pp. 66-86.

Z. Popovic, "Micro-coaxial micro-fabricated feeds for phased array antennas," in IEEE Int. Symp. on Phased Array Systems and Technology, Waltham, MA, Oct. 2010, pp. 1-10. (Invited).

"Shiffman phase shifters designed to work over a 15-45GHz range," phys.org, Mar. 2014. [online: http://phys.org/wire-news/156496085/schiffman-phase-shifters-designed-to-work-over-a-15-45g hz-range.html].

Extended EP Search Report for EP Application No. 12811132.5 dated Feb. 5, 2016.

International Search Report and Written Opinion for PCT/US2015/063192 dated May 20, 2016.

International Search Report and Written Opinion for PCT/US2015/011789 dated Apr. 10, 2015.

Derwent Abstract Translation of WO-2010-011911 A2 (published 2010).

Tian, et al.; Fabrication of multilayered SU8 structure for terahertz waveguide with ultralow transmission loss; Aug. 18, 2013; Dec. 10, 2013; pp. 13002-1 to 13002-6.

* cited by examiner

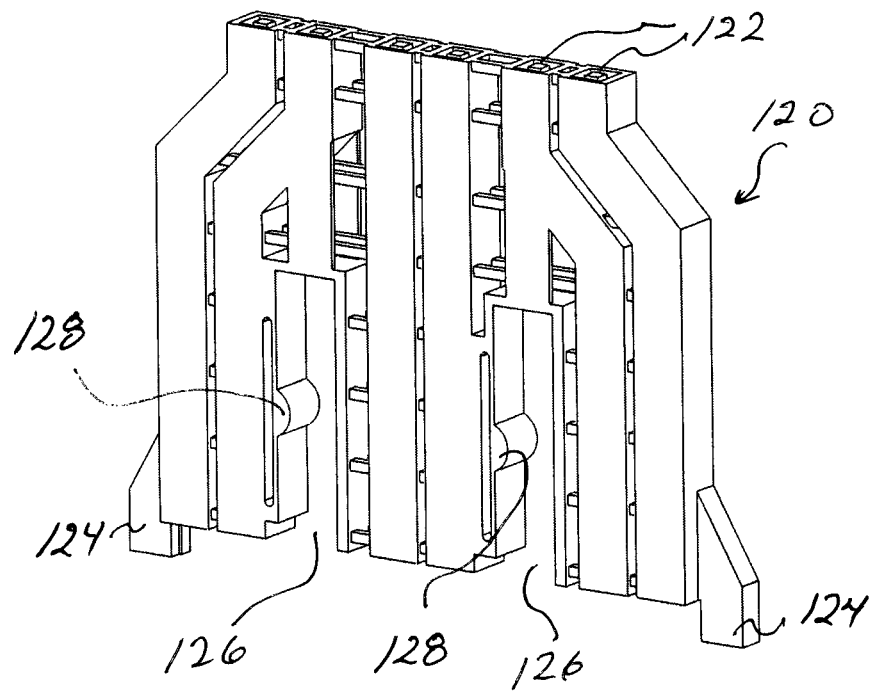
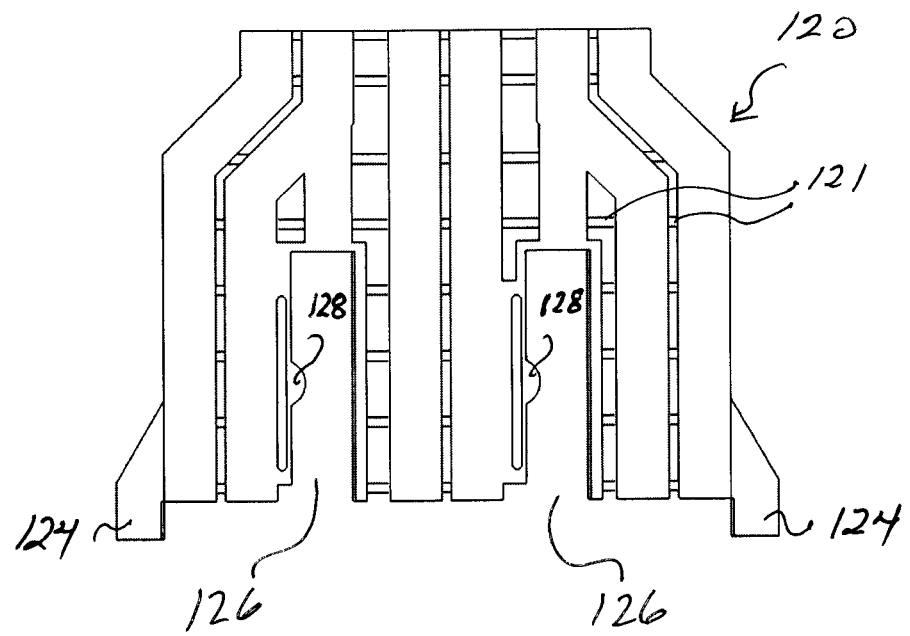
FIG. 3

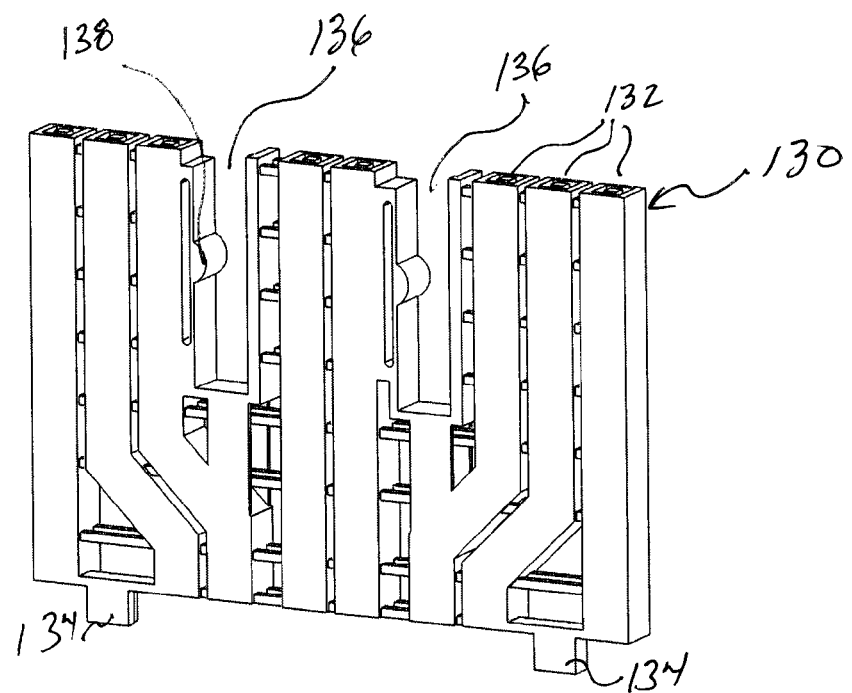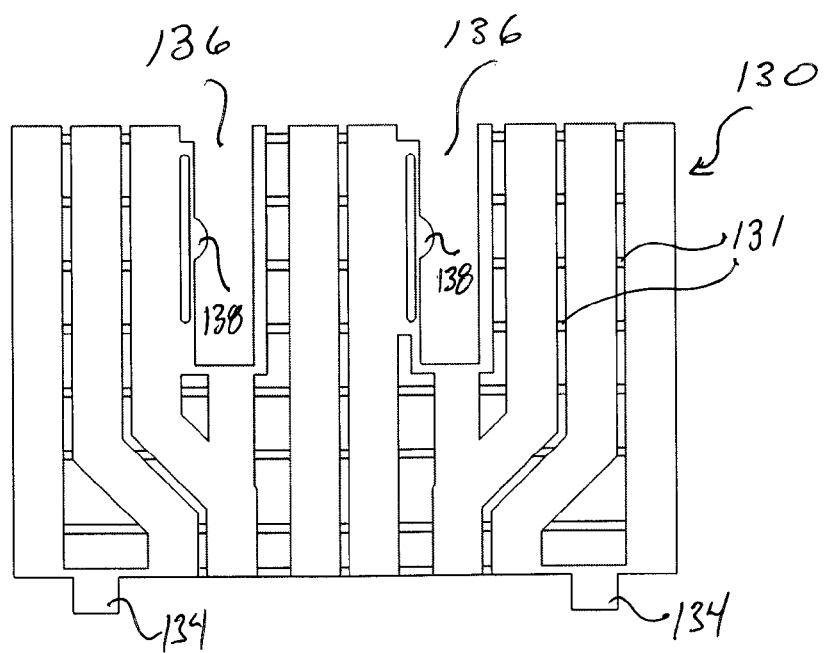
FIG. 4

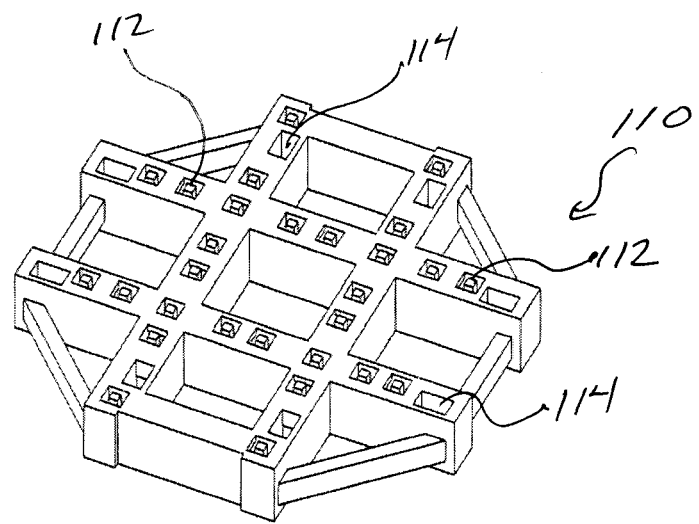
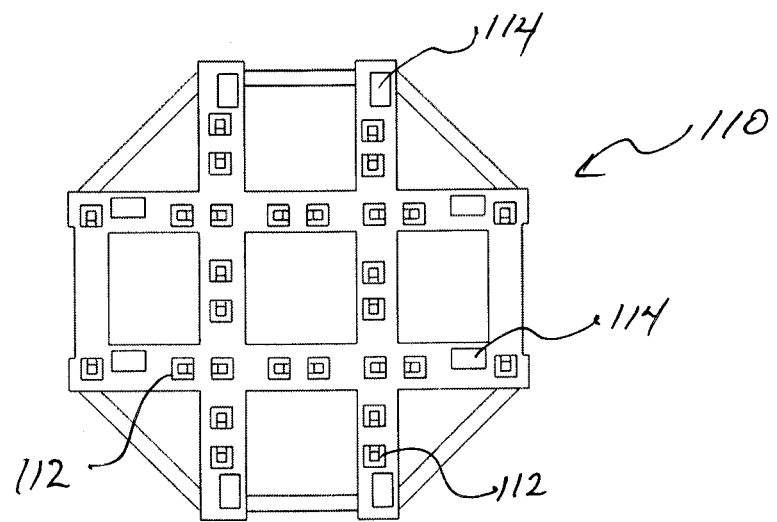
FIG. 5

SECTION A-A

SECTION A-A

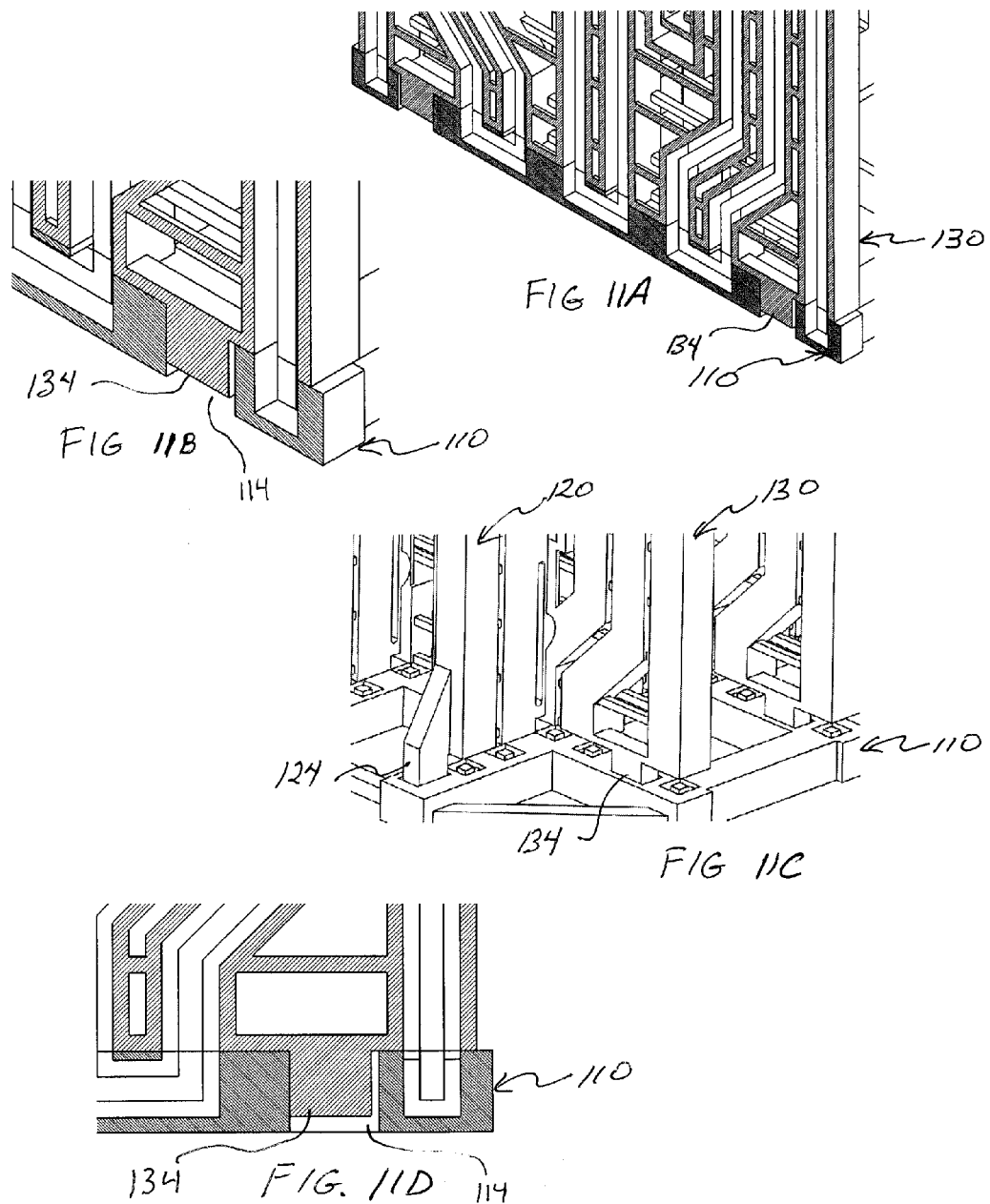

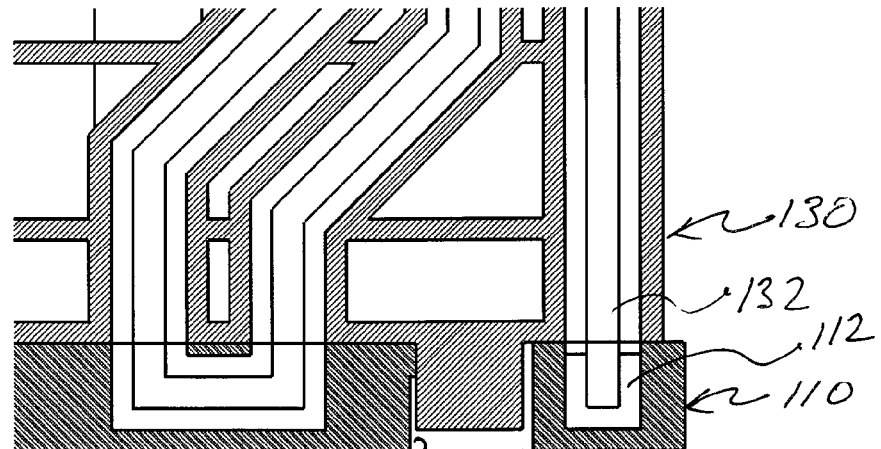
FIG. 15A
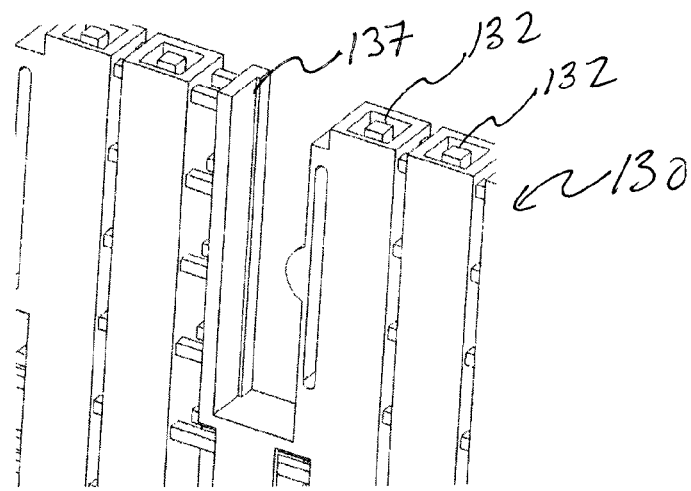
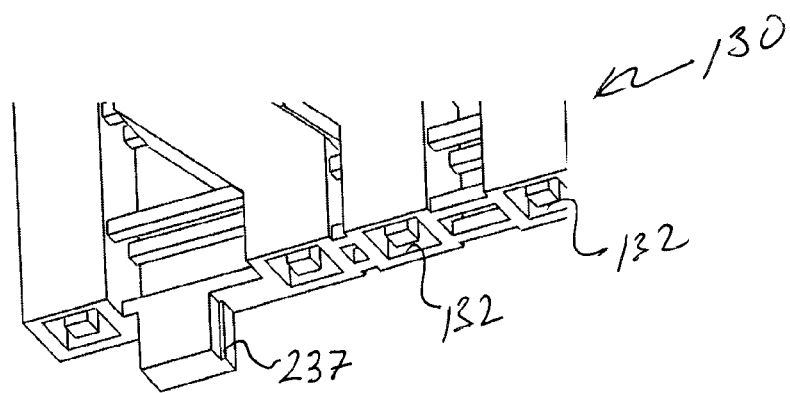
FIG. 15B

US 9,888,600 B2

SUBSTRATE-FREE INTERCONNECTED ELECTRONIC MECHANICAL STRUCTURAL SYSTEMS

RELATED APPLICATIONS

This application claims the benefit of priority of U.S. patent application Ser. No. 14/211,407, filed on Mar. 14, 2014, which claims the benefit of U.S. Provisional Application No. 61/788,675, filed on Mar. 15, 2013, the entire contents of which application(s) are incorporated herein by reference.

FIELD OF THE INVENTION

The present invention relates generally to substrate-free, interconnected electronic and/or electromechanical systems, and more particularly, but not exclusively, to substrate-free mechanical structural systems comprised of interconnected subsystems of electronic and/or electromechanical components.

BACKGROUND OF THE INVENTION

There exists a need to create electronic and electromechanical systems often comprising dozens to many thousands of interconnects between subassemblies or modules. Several to many of said subassemblies may require to be joined to provide a solution for the final assembly that includes electrical, thermal, optical, mechanical and other forms of transduction and communication and also provide stability and support for the total assembly.

In building complex multilayer electronic and electromechanical systems, particularly those of high complexity, and high value, there remain challenges in building said systems with sufficiently high yield and or low re-work to produce said systems economically. This is particularly true when providing such systems in low quantity or with substantial customization or when providing reconfigurability and re-use of the key subsystems or modules comprising the integrated system.

For example, the desktop computer industry approached a similar but larger volume problem since at least the 1980s by creating motherboards and computer daughter cards with standardized connectors where the card and motherboard could be electrically and mechanically joined by one plugging into arrayed connectors and then being mechanically fastened to a metal chassis, for example, by screws. By doing so, cards could be replaced if defective, swapped to change functionality, and even motherboards replaced as necessary. Such boards and cards may be viewed as functional modules of desired computer system that could be produced and tested independently of the final integrated computer system. Favorable benefits included not only improved yield and decreased rework, but also reduction in size of the system by allowing it to become compact in a 3D volume due to the perpendicular interconnect.

This problem however is less straightforward for systems where one or more of the size, complexity, integration, weight, performance, or cost of desired interconnection becomes a limiting factor to produce the desired system. Even cooling such systems, for example in the aforementioned desktop computer, can remain a challenge, since forced air by using multiple fans becomes a difficult method to remove heat from all locations necessary. Also, thermal conduction through heat pipes and thermal busses and ground planes make modularity a challenge.

One can imagine maintaining the benefits of modularity would be desirable as one scales down in feature size or dimensions and scales up in complexity, functionality, and performance. Indeed this challenge has largely been addressed in modern consumer electronics by increasingly providing the functionality desired within microchips using integrated circuit technology where the size of the device's constituent elements, such as transistors, capacitors, resistors, and so on, have substantial improvements in reduced size and increased performance over discrete components. This trend of pushing so much desired functionality into densely integrated chips which are permanently attached, combined with a rapid obsolescence rate has made it almost commonplace to dispose of the system if it fails; repair is too complicated and/or the cost of such repair exceeds the value of the system.

Compare this situation to one where the value of the components or chips or modules are very high but one or more of the integration density, size, weight, yield, performance and price are limiting factors, such that rework and modularity are required. Add to this the inability for any single semiconductor technology to provide all the performance or functions desired, or there simply being added constraints that make it impractical to integrate all the functions intimately into a chip or wafer level process. For example, a microwave phased array requires many functions, levels of interconnect, routing of signals, power, and heat dissipation. The area it needs to consume is based on performance limitations of its transmit/receive elements, but are also limited by the frequencies/wavelengths of its operation. For example at lower frequencies like X or S band, the pitch of the needed antenna elements are on a large spacing such that a wafer-level phased array does not appear to make sense even if the performance of the electronic components needed for each element were not the limiting factor. If one needed high power at S band, semiconductor technologies like GaN integrated circuits may be able to provide it, but it would not be economic to waste the un-needed area required by the antenna element spacing for a semiconductor technology any more than it would make sense to provide the many functions of a computer motherboard through complete integration onto a large semiconductor wafer.

Still there is the desire to combine many complex functions for systems such as phased arrays or mm-wave power amplifiers into the minimum size, volume, and weight possible. For many high end and often low volume applications, for example satellite applications, there is also the desire to not compromise performance.

Previous art has outlined interconnect technologies that can provide the routing and distribution of power and signals from DC to many hundreds of GHz. For example the PolyStrata® additive sequential build technology developed and being commercialized by Nuvotronics LLC, Radford Va., USA is one such technology. Its ability to produce multi-layer, low dispersion, high isolation, coaxial and waveguide interconnection, combined with its high thermal conduction and ability to integrate thermal pathways, as well as its ability to interconnect with minimal excess parasitics to monolithic microwave integrated circuits, RF and DC passive, and antenna elements makes it an ideal integration medium, similar to the use of circuit board technology that has integrated chips and other components for electronic applications.

Still the cost, yield, and complexity of the desired components to produce systems that push the edge of the state of the art in electronics may be such that modularity and rework are necessary economically and practically to produce such desired systems. However solving the challenges of modularity and rework when size and performance and even mechanical requirements of the necessary interconnect remains unsolved. Currently the microelectronics industry approaches similar commercial problems using methods such as chip-stacking technology, through-substrate vias, tiered wirebonds, and in some cases attempts to integrate more than one semiconductor technology onto a single wafer. While these approaches may solve certain problems in volume production for reduced size, weight, and interconnection, they are not technologies that readily lend themselves to lower volumes, particularly where it is desired to have relatively un-compromised performance, rework, or modularity.

A further problem in existing electronic and electromechanical systems relates to chip or component interconnects. For instance, traditionally a semiconductor circuit or MEMS device is formed on wafer and then diced or otherwise separated into chips. For example, a chip such as a MMIC power amplifier made on a GaAs wafer. The chip would be formed with metal pads for probing and bonding to connect to the chip. Typically the back surface of the chip would be connected to a heatsink and electrical ground plane and then the front surface containing the bond pads would be wedge-bonded or wirebonded into a surrounding circuit; alternatively the chip may be connected to a leadframe of a chip package, or packaged or used otherwise as is known in the art. In all of these cases, metal connections made by fused small wires such as gold wires, or by solders, are used to electrically join the chip's bond pads typically located around a perimeter of a chip, to the rest of the circuit, or are connected to leads for example of a lead-frame, to package it. In the electronics industry today, high value chips can often be packaged in a manner that they can be inserted and removed from a separately formed chip-socket, said socket typically disposed on a motherboard. The chip socket provides the electrical and sometimes the thermal interfaces to and from the packaged chip. An example of this is the CPU on computer motherboards. Because the CPU is often the most expensive component and because it is desirable to be able to replace it to upgrade or service the computer system, the chip is packaged in a way to work in conjunction with a partner socket, allowing the packaged chip to be removed and replaced—thereby maintaining and improving the serviceability, versatility, and lifetime of the computer system. It remains a desirable and unmet need to reduce the size, mass, and form factor of a chip interconnection system—while improving performance. It would be desirable to have a system where the chip does not need to be additionally packaged and instead the "bare die" can be inserted and interconnected into the system and still removed to be replaced without rework that often requires steps such as cutting wirebonds or desoldering bumps and/or removing difficult to service adhesive or encapsulation layers intended to be permanent.

The PolyStrata® additive sequential build technology by Nuvotronics (disclosed in U.S. Pat. Nos. 7,012,489, 7,148,772, 7,405,638, 7,948,335, 7,649,432, 7,656,256, 8,031,037, 7,755,174, and 7,898,356, the contents of which patents are incorporated herein by reference), for example, has addressed the ability to integrate independently fabricated standard connectors including microwave connectors. It also has demonstrated stacked and lateral interconnect through conventional means such as solder joints. Independently fabricated and integrated connectors have the disadvantage of consuming substantial volume, size and even weight compared to the dimensions of chips and PolyStrata® additive sequential build technology integration substrates. In addition when many such interconnections are needed, substantial joining force and size mismatch become a limiting factor, for example in connecting dozens or hundreds of RF and DC interconnects. As frequency scales to mm-wave and beyond, loss and mismatch also become greater problems. Alternate methods to create similar 2.5 and 3D structures may be used to form part or all of the systems and subsystems outlined in this disclosure. For example, some of those have been described by Nuvotronics in international patent application publication number WO/2013/010108 "Methods of fabricating electronic and mechanical structures," the contents of which are incorporated herein by reference.

Alternatively direct PolyStrata® additive sequential build technology of board to board stacking or lateral joining connections between the coaxial RF, DC, waveguide, or thermal pathways may be based on direct solder joints at transition regions typically of the edges or upper or lower surfaces. Those interconnections based on solder joints have the disadvantage of often requiring the reflow of the solder to ensure a stable DC and RF junction that for example can allow testing or use in the field. Such reflow on a small scale becomes a challenge as, in increasingly small areas, limiting the flow or wicking or capillary action of the solder—as well as maintaining a thermal solder reflow or bonding hierarchy that doesn't interfere with the attach of nearby chips or other components or modules—becomes difficult to manage. Also solders in substantially small volumes become difficult to control compositionally due to mechanisms such as inter-diffusion and consumption of noble metals and diffusion barriers that may be applied in the junction regions. Embrittlement of the joint are common issues that arise when small solder volumes are utilized. Exact height and position control also become a challenge when solder bumps or joints may be many 10's to 100's of microns in thickness even after reflow; meanwhile, an advantage present in an additive sequential build technology such as PolyStrata® technology is reproducibility and control of gaps and distances that may be on the order or several microns or less. A high degree of planarity may be crucial for making multiple micron-scale interconnections across large, multiple-centimeter distances.

SUMMARY OF THE INVENTION

In one of its inventive aspects the present invention provides "substrate-free" (or "free-standing") mechanical structural systems comprised of interconnected subsystems of electronic and/or electromechanical components. Exemplary electronic and/or electromechanical components may include, without limitation, waveguides, e.g. coaxial waveguides, DC and RF transmission lines, filters, couplers, combiners, antennas, distribution networks, integrated connectors, semiconductor devices, surface-mount electronic components, and mechanical features to enable alignment and joining of said subsystems. Such electronic and/or electromechanical components may be heterogeneous or monolithic. "Heterogeneous component" is defined to include items that cannot be formed in a monolithic process, such as semiconductor devices, surface-mount electronic components and other devices, for example. "Monolithic component" is defined to mean items that are formed in a monolithic process, such as filters, couplers, combiners, antennas, distribution networks, integrated connectors, and mechanical features to enable alignment and joining of said subsystems, for example.

As used herein the terms "substrate-free" or "free-standing" are defined to mean electronic and/or electromechanical subsystems that may be formed, grown, or otherwise created on a substrate but which are subsequently removed from, and no longer a part of, the substrate. In this regard, the substrate may simply be a surface for formation that does not become a permanent part of the subsystem. The substrate may be a handle wafer such as a silicon, ceramic, metal or glass wafers or panels used to handle the substrate-free subsystems in their formation, for example. A substrate may have a surface shape that is circular, or rectangular, or of any shape that aids in handling during a standardized manufacturing process flow. A substrate may be any flat work surface, for example, on which the subsystem is formed such as a stainless steel sheet or blank silicon wafer or a glass sheet or a ceramic platen. A substrate may be used in an additive sequential build process such as PolyStrata® processing or in a machine-based build such as one using a 3D solid printer, for example. It is within the scope of the present disclosure that the substrate could be planar or non-planar, resulting in a planar or non-planar subsystem; for example, a substrate could contain curvature out of a plane if the subsystem to be formed on the substrate is to take on that non-planar shape once separated.

Unlike circuit-boards, substrate-free electronic and/or electromechanical components contain no board. A board is the cohesive material that gives the circuit boards their primary shape, form, and stability. Similarly, unlike an integrated circuit on a chip, substrate-free components in accordance with the present invention contain no chip substrate. As such planar subsystems in accordance with the present invention may comprise substrate-free and mechanically interconnected DC and RF transmission lines, monolithic components, and mounting regions for heterogeneous component attachment. As used herein "interconnected" means mechanically joined to create a system wherein the subsystems are in communication electrically, thermally, optically, and/or fluidically and are mechanically interlocked permanently or temporarily to form a desired system.

A beneficial aspect of structural systems in accordance with the present invention is that the majority of unnecessary material or substances which do not add value to, or may even detract from, the intended functions for the system can be eliminated. Thus, mass, bulk, physical properties mismatch (such as expansion coefficient mismatch) of the substrate may be eliminated by eliminating the substrate, thereby eliminating unnecessary impediments to access to various surfaces of the system or subsystem.

Accordingly, in one of its aspects the present invention may provide a substrate-free, interconnected electronic mechanical structural system, comprising first and second substrate-free, electronic subsystems each including electronic components therein. Each subsystem may include respective mechanical connection features, which may be structured to cooperate with one another to mechanically interconnect the first and second substrate-free, electronic subsystems. The electronic components on at least one of the subsystems may include one or more of a heterogeneous component, a monolithic component, a coaxial waveguide, and an electromechanical component. The first and second substrate-free, electronic subsystems may be disposed in one or more of electrical, thermal, optical, and/or fluidic communication, and the electronic components on at least one of the subsystems may include mechanically interconnected DC and RF transmission lines. The connection features of the first substrate-free, electronic subsystem may include a slot or protrusion and the connection feature of the second substrate-free, electronic subsystem may include a slot for receiving the slot or protrusion of the first substrate-free, electronic subsystem. A spring or tapered fit or stepped interference fit may also be provided to orient and retain the second-substrate-free, electronic subsystem in position relative to the first substrate-free, electronic subsystem.

In another of its aspects, the present invention may provide a method of forming a substrate-free, interconnected electronic mechanical structural system, comprising creating a first electronic subsystem by depositing a plurality of layers on a substrate, wherein the layers comprise one or more of a conductive material, a sacrificial material, and a non-conductive material, thereby forming an electronic structure. The first electronic subsystem may include electronic components and a first connection feature structured to permit interconnection with one or more additional electronic subsystems. The method may further include removing the sacrificial material, and removing the first electronic subsystem from the substrate to provide a first substrate-free, electronic subsystem. The electronic components formed by the method may include one or more of a heterogeneous component, a monolithic component, a coaxial waveguide, and an electromechanical component. The connection features formed by the method may include a slot or protrusion in the first substrate-free, electronic subsystem and may include a slot in the second substrate-free, electronic subsystem for receiving the slot or protrusion of the first substrate-free, electronic subsystem. The method may also provide a spring or interlock or latch to orient and retain the second-substrate-free, electronic subsystem in position relative to the first substrate-free, electronic subsystem.

The method may also include creating a second electronic subsystem by depositing a plurality of layers on a substrate, wherein the layers comprise one or more of a conductive material, a sacrificial material, and a non-conductive material, thereby forming an electronic structure, comprising electronic components and a second connection feature structured to permit interconnection with the first electronic subsystem. The sacrificial material may be removed, and the second electronic subsystem may be removed from the substrate to provide a second substrate-free, electronic subsystem. The first and second substrate-free, electronic subsystems may be interconnected by joining the first and second connection features to provide the substrate-free, interconnected electronic mechanical structural system. The interconnected first and second substrate-free, electronic subsystems may be disposed in one or more of electrical, thermal, optical, and/or fluidic communication.

BRIEF DESCRIPTION OF THE DRAWINGS

The foregoing summary and the following detailed description of exemplary embodiments of the present invention may be further understood when read in conjunction with the appended drawings, in which:

FIG. 3 schematically illustrates isometric and front views of the first (horizontal) substrate-free, electronic mechanical subsystem of FIG. 1;

FIG. 4 schematically illustrates isometric and front views of the second (vertical) substrate-free, electronic mechanical subsystem of FIG. 1;

FIG. 5 schematically illustrates isometric and top views of the base plate of the substrate-free, interconnected electronic mechanical structural system of FIG. 1;

FIGS. 11A-11D schematically illustrate isometric cross-sectional views (FIGS. 11A, 11B), an isometric view (FIG. 11C), and a front cross-sectional view (FIG. 11D) showing alignment pegs of the first and second substrate-free, electromechanical subsystems and corresponding mating holes of the base plate of FIG. 1;

FIG. 15A schematically illustrates a cross-sectional front view of a portion of the first substrate-free electronic mechanical subsystem and base plate, showing mechanical and electrical interconnection between the respective waveguides thereof and cooperation between the mechanical mating features of the exemplary peg and hole; and FIG. 15B schematically illustrates isometric views of upper and lower surfaces of the second substrate-free electronic mechanical subsystem showing waveguide end portions at each of the upper and lower surfaces.

DETAILED DESCRIPTION OF THE INVENTION

Figure 1:
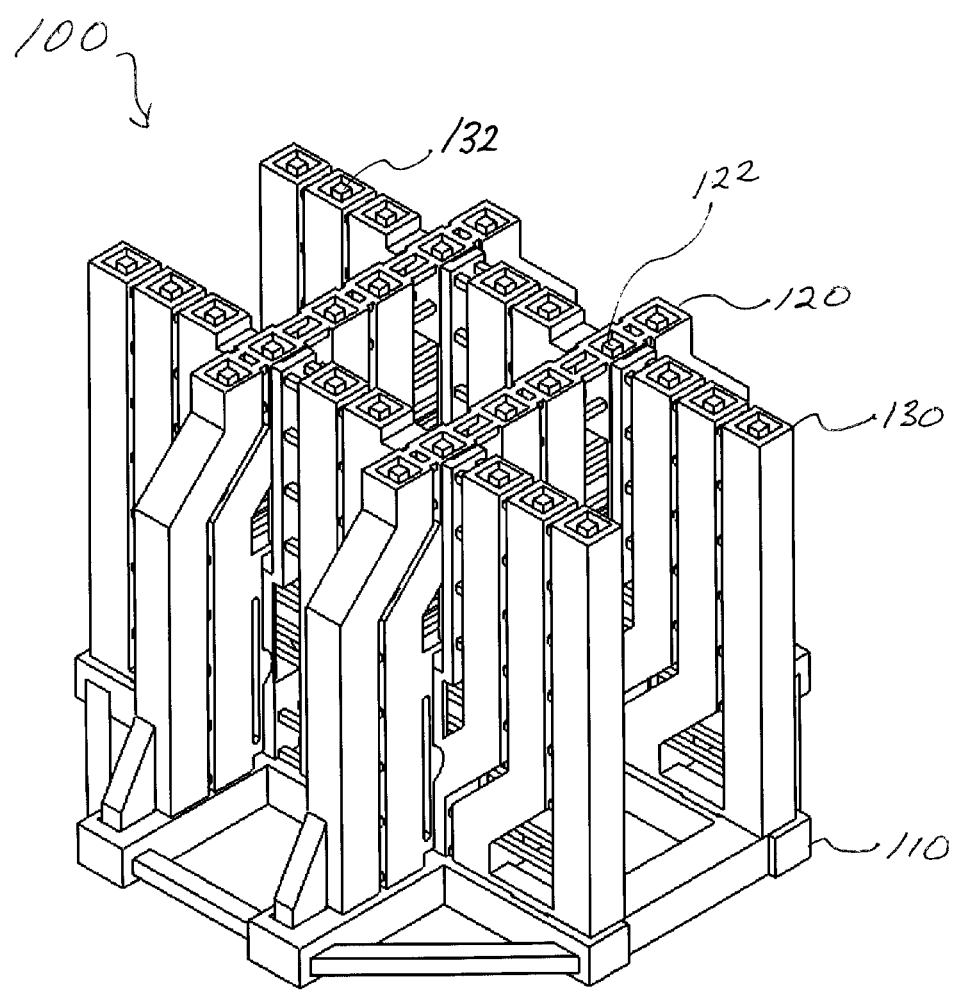
FIG. 1 schematically illustrates an isometric view of an exemplary assembled substrate-free, interconnected electronic mechanical structural system in accordance with the present invention.
Figure 2:
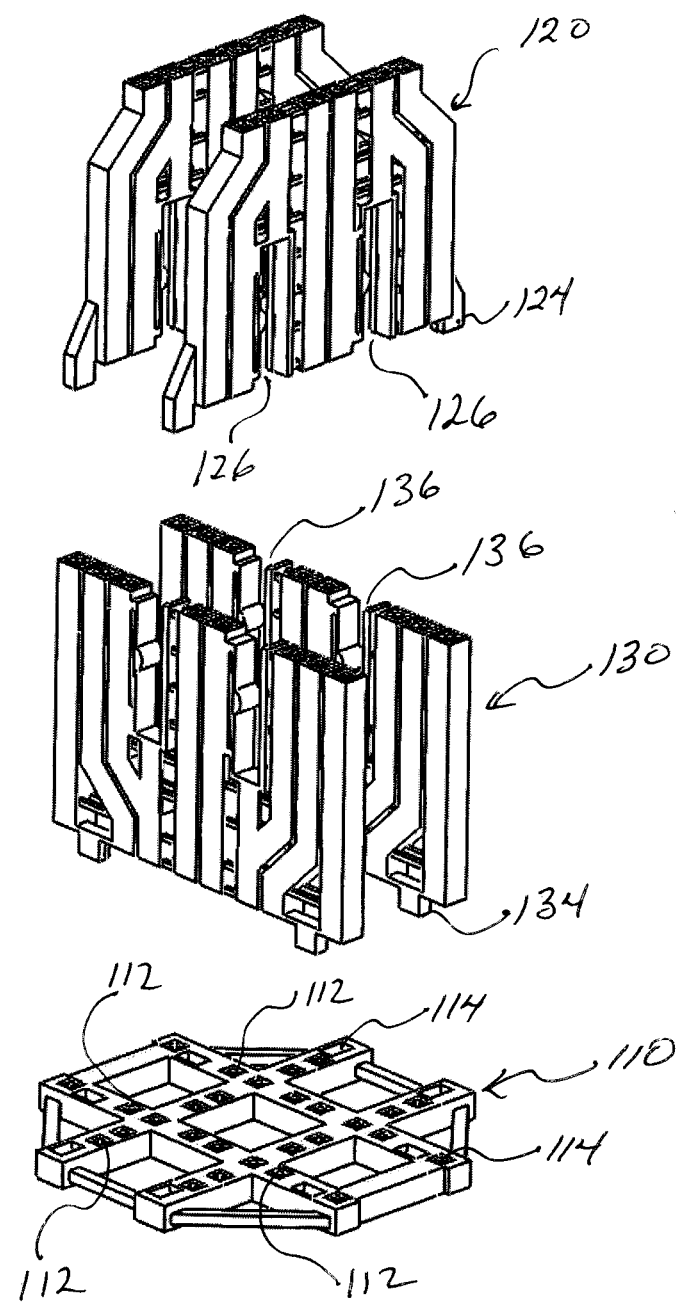
FIG. 2 schematically illustrates an exploded view of the assembled substrate-free, interconnected electronic mechanical structural system of FIG. 1.

Referring now to the figures, wherein like elements are numbered alike throughout, FIGS. 1 and 2 schematically illustrate isometric views of an exemplary substrate-free, interconnected electronic mechanical structural system 100 (FIG. 1) in accordance with the present invention, in both assembled and exploded views, respectively. The interconnected electronic mechanical structural system 100 may include first and second substrate-free, electronic subsystems 120, 130 and a substrate-free, electronic base plate 110 each of which may include electronic components, such as coaxial waveguides 112 (FIG. 2), 122, 132, (FIG. 1) as well as mechanical connection features, such as complementary mating slots 126, 136, and mounting pegs 124, 134 with complementary mounting holes 114, for example, FIG. 2. The mechanical connection features, e.g., slots 126, 136, pegs 124, 134, and holes 114, may be configured to permit the substrate-free, electronic subsystems 120, 130 and base plate 110 to be reversibly or irreversibly pressfit together into a single interconnected structural system 100. In addition, the electronic components, e.g., coaxial waveguides 112, 122, 132, may be configured so that in the assembled interconnected structural system 100 one or more of the coaxial waveguides 112, 122, 132 are connected in electrical and/or mechanical communication, for example. Thus, the substrate-free, electronic subsystems 120, 130 and base plate 110 may be configured to include electronic components 112, 122, 132 that are operably and electrically interconnected upon assembly, which is aided and enabled by the mechanical connection features 114, 124, 126, 134, 136.

It should be clear that while a simple system of interconnected coaxial transmission lines 112, 122, 132 and mechanical connections 114, 124, 134 are shown in each subsystem 110, 120, 130 to illustrate the concepts, that the system and subsystems 110, 120, 130 may typically include monolithic features such as chip and SMT device mounting sockets or regions, phase controlled passive components such as hybrids, filters, baluns, couplers, combiners, and so forth. Antennas, beam forming networks, switching networks, and integrated inductors, capacitors, and resistors may be included. In any place where coaxial transmission lines 112, 122, 132 are shown, they could be substituted in part or entirely for regions hollow, ridge or co-planar waveguides, suspended DC bias and control lines, or suspended CPW, for example. Interconnected metal features may be added for mechanical purposes or thermal transmission purposes, or both.

While the empty space between dielectrics and metals may typically be air, vacuum, a particular gas or fluid or liquid could fill the space. Alternative materials that allow a substitute for an air or vacuum dielectric to fill the space such as a very low-k syntactic foam, as outlined in published US patent application publication number 2012/0067871, could alternatively fill part of the volume in a subsystem before or after the system assembly process, the contents of that application are incorporated herein by reference. For example, it is possible the system 100 could be submerged into a region of cold gas or liquid or have the gas or liquid flow through or around the mostly open 3D volume available to the system. While most of the subsystems 110, 120, 130 may be rigid mechanically, it is possible that some subsystems could take advantage of the mechanical versatility of hinges, slides, pivots, turrets, gears, and flexures, for example, to allow the system to unfold from a folded position or adjust the position among or within the subsystems, for example, taking form after deployment. This may be advantageous for example if the system 100 needs to be launched into space in a compact form, and then have the system 100 self-position and adjust the electrical and mechanical relationships among and within the subsystems 110, 120, 130 that comprise the system once in space and reduced levels of acceleration and vibration are encountered. Such modularity may be equally important if repairs or reconfiguration after deployment is needed.

In particular, considering the system components in more detail, FIG. 3 schematically illustrates an isometric in front view of a first substrate-free, electronic subsystem 120 in accordance with the present invention. The substrate-free, electronic subsystem 120 may include a plurality of rectangular coaxial waveguides 122 that may extend from a first end to a second end of the first subsystem 120. Likewise, a second substrate-free, electronic subsystem 130 may include a plurality of rectangular coaxial waveguides 132 that may extend from a first end to a second end of the subsystem 130, FIG. 4. Since the first and second subsystems 120, 130 are substrate-free, added structural support may be desired it may be provided by ribs or struts 121 (FIG. 3), 131 (FIG. 4) or other suitable structures.

Figure 6A:
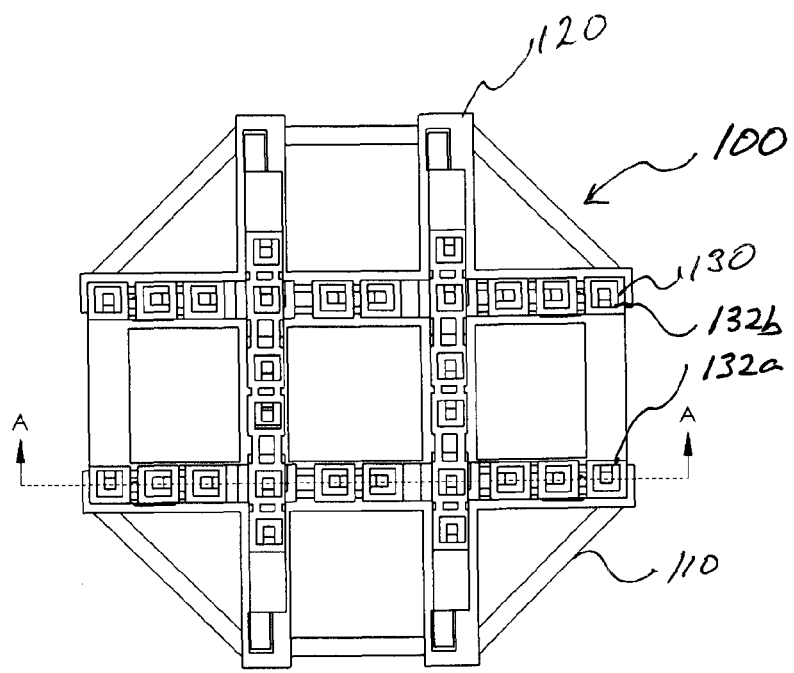
FIG. 6A schematically illustrates the top view of the assembled substrate-free, interconnected electronic mechanical structural system FIG. 1.
Figure 12A:
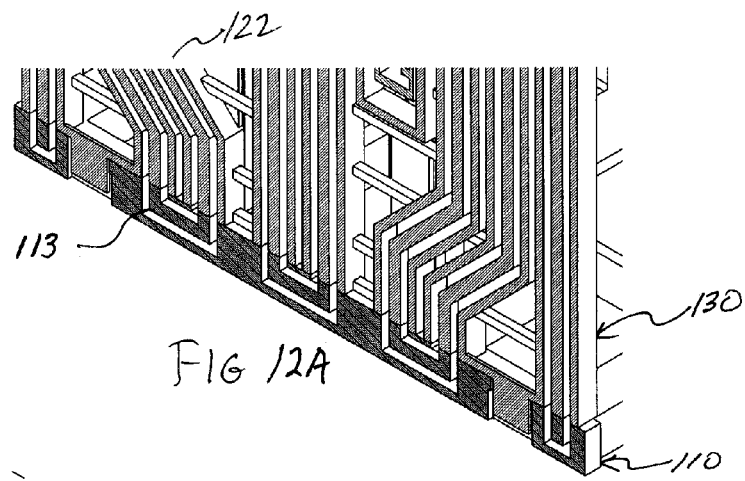
FIGS. 12A-12C schematically illustrate isometric cross-sectional views (FIGS. 12A, 12B) and a front cross-sectional view (FIG. 12C) showing electrical and physical interconnection between coaxial waveguides of the first substrate-free electronic mechanical subsystem and coaxial waveguides of the base plate of FIG. 1.
Figure 12B:
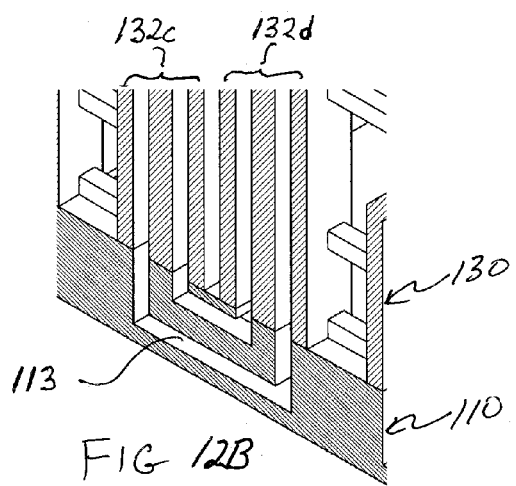
Figure 12C:
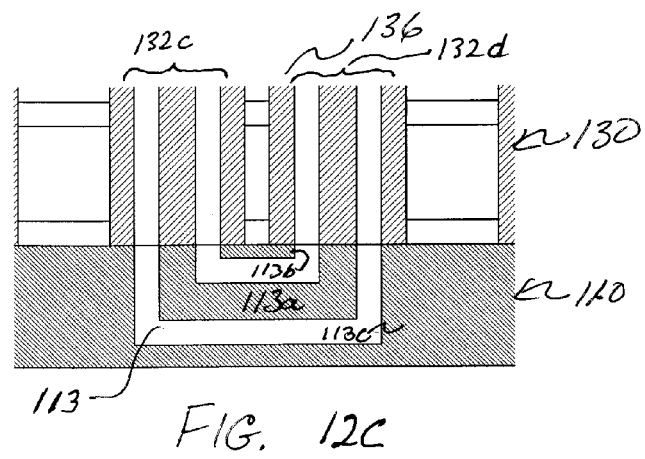
Figure 13:
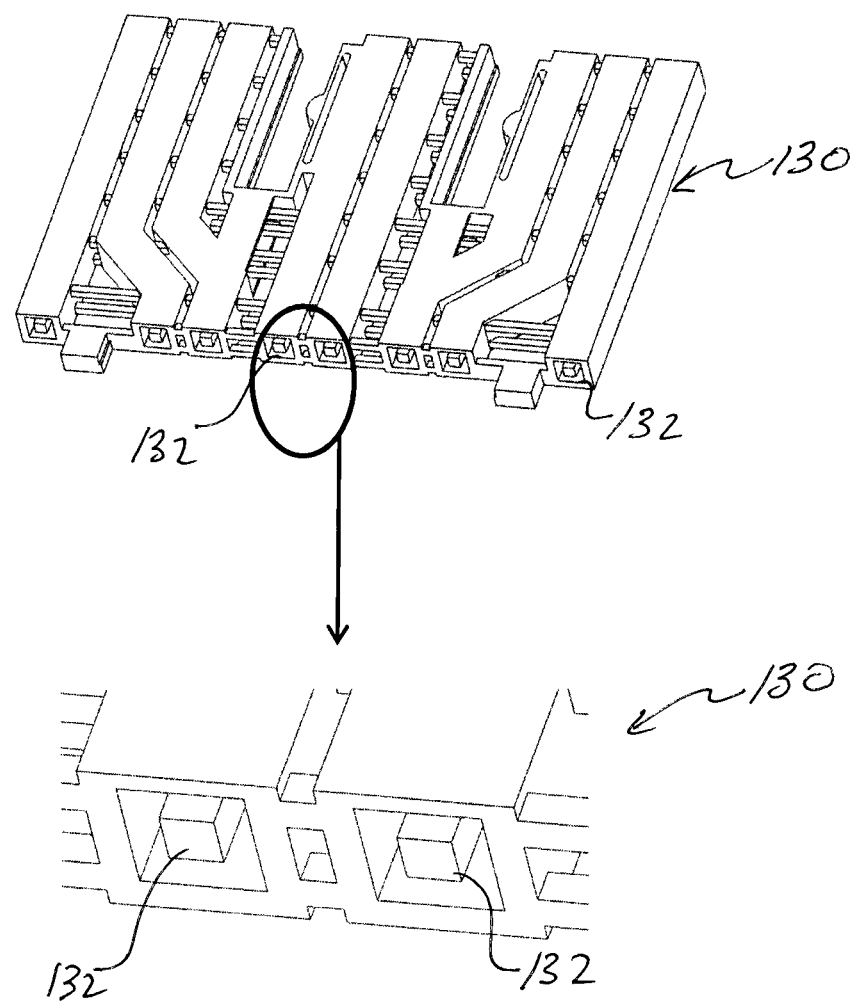
FIG. 13 schematically illustrates an isometric view of a lower surface of the first substrate-free electronic mechanical subsystem, showing waveguide end portions at the lower surface for electrical and mechanical connection to the base plate of FIG. 1.
Figure 14:
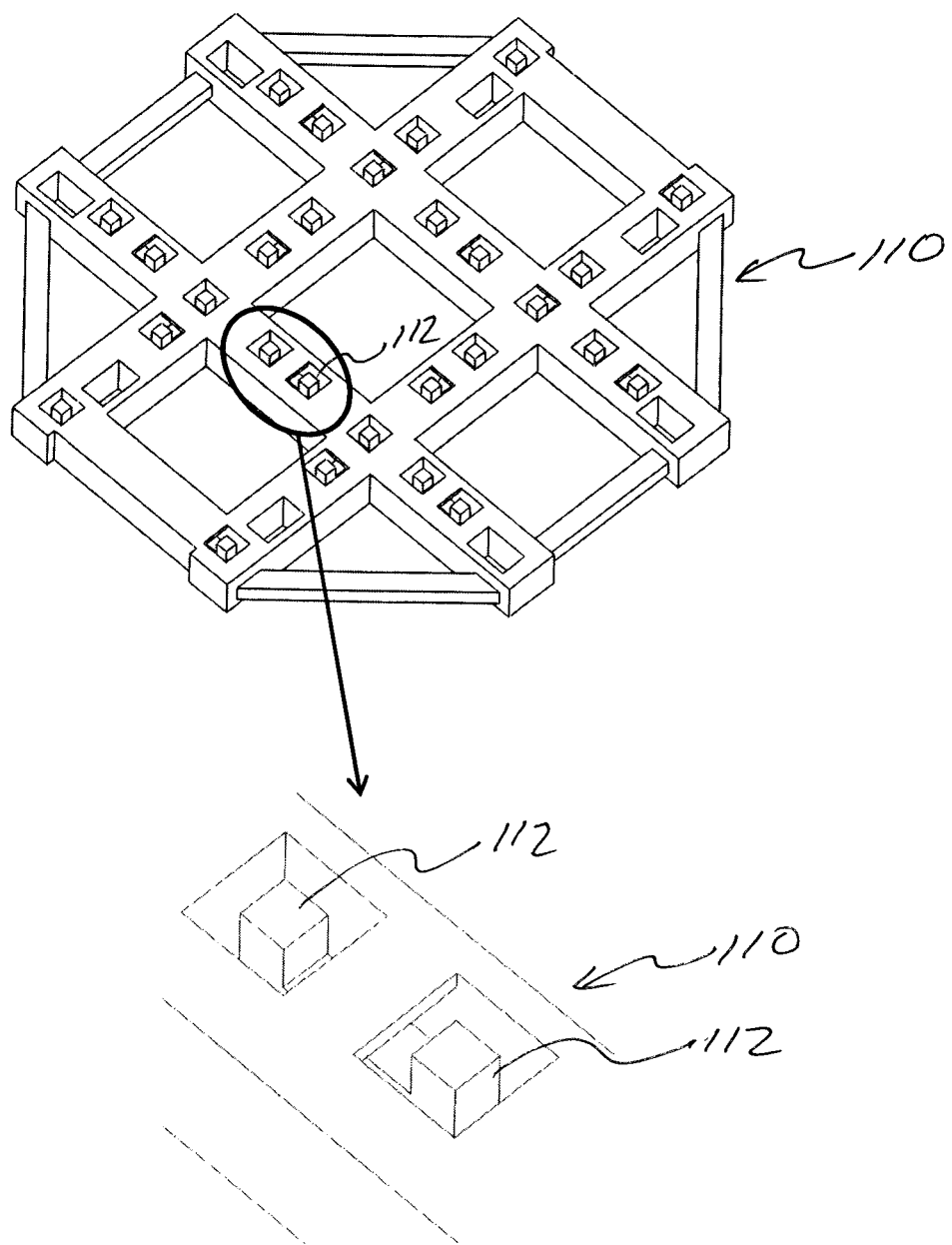
FIG. 14 schematically illustrates an isometric view of the upper surface of the base plate of FIG. 1, showing waveguide end portions at the upper surface for electrical and mechanical connection to the first and second substrate-free electronic mechanical subsystems.

In the particular exemplary configuration illustrated, the coaxial waveguides 132 may include end portions at respective opposing and faces of the first and second subsystems 130, FIGS. 13, 15B, that are structured to permit coupling, e.g. butt coupling or end coupling, to other subsystem components such as electronic components of the substrate-free, electronic base plate 110 (FIG. 15A). In this regard, the base plate 110 may include a plurality of coaxial waveguides 112 (FIG. 15A) or waveguide coupling terminations 113 (FIGS. 12A-12C) for electrical and mechanical connection to the waveguides 122, 132 of the first and second subsystems 120, 130, respectively, FIGS. 2, 5, 7, 14. For example, a first waveguide 132 of the first substrate-free, electronic subsystem 130 may be butt coupled to a respective waveguide 112 of the base plate 110, FIGS. 6A, 6B. The waveguide 112 of the base plate 110 may extend along the base plate 110 to terminate at a second location in electrical and mechanical communication with a second waveguide 132*b* of the second substrate-free, electronic subsystem 130 to electrically couple first and second waveguides 132*a*, 132*b*, FIGS. 6A, 7. Alternatively, the substrate-free, electronic base plate 110 may include waveguide coupling terminations 113 (FIG. 6B) to electrically connect two or more adjacent coaxial waveguides 132*c*, 132*d*, FIGS. 12A-12C. In this regard, the waveguide coupling termination 113 may include a center conductor coupler 113*a* to electrically couple the respective center conductors of the adjacent coaxial waveguides 132*c*, 132*d*, FIGS. 7, 12C. Likewise, the waveguide coupling termination 113 may include outer conductor (ground plane) couplers 113*b*, 113*c* (FIG. 12C) to electrically couple the respective outer conductors of the coaxial waveguides 132*c*, 132*d* (FIG. 12C).

Figure 6B:
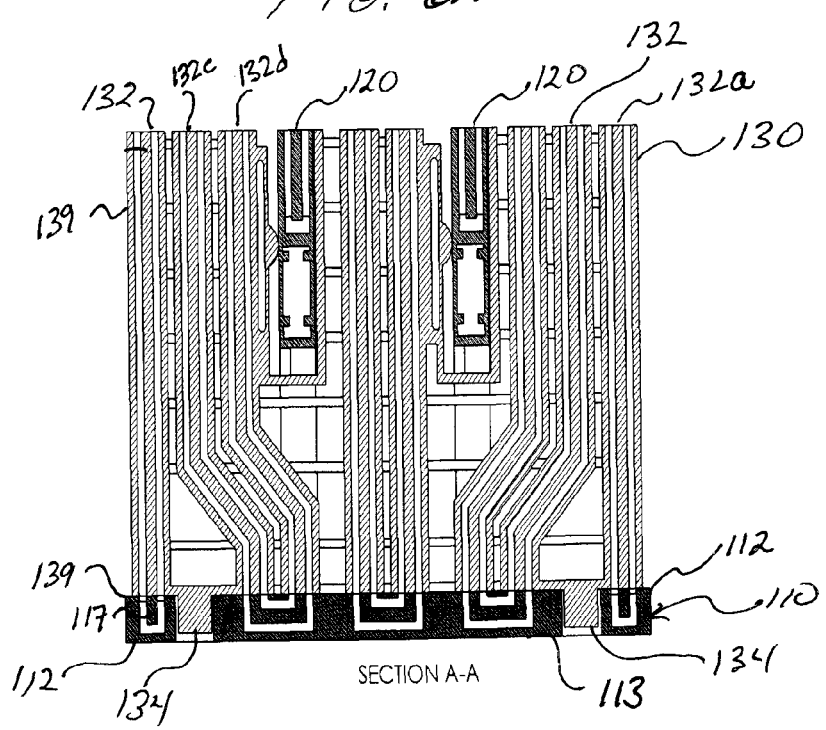
FIG. 6B schematically illustrates a cross-sectional view of the assembled substrate-free, interconnected electronic mechanical structural system of FIG. 6A taken along the sectioning line A-A.
Figure 7:
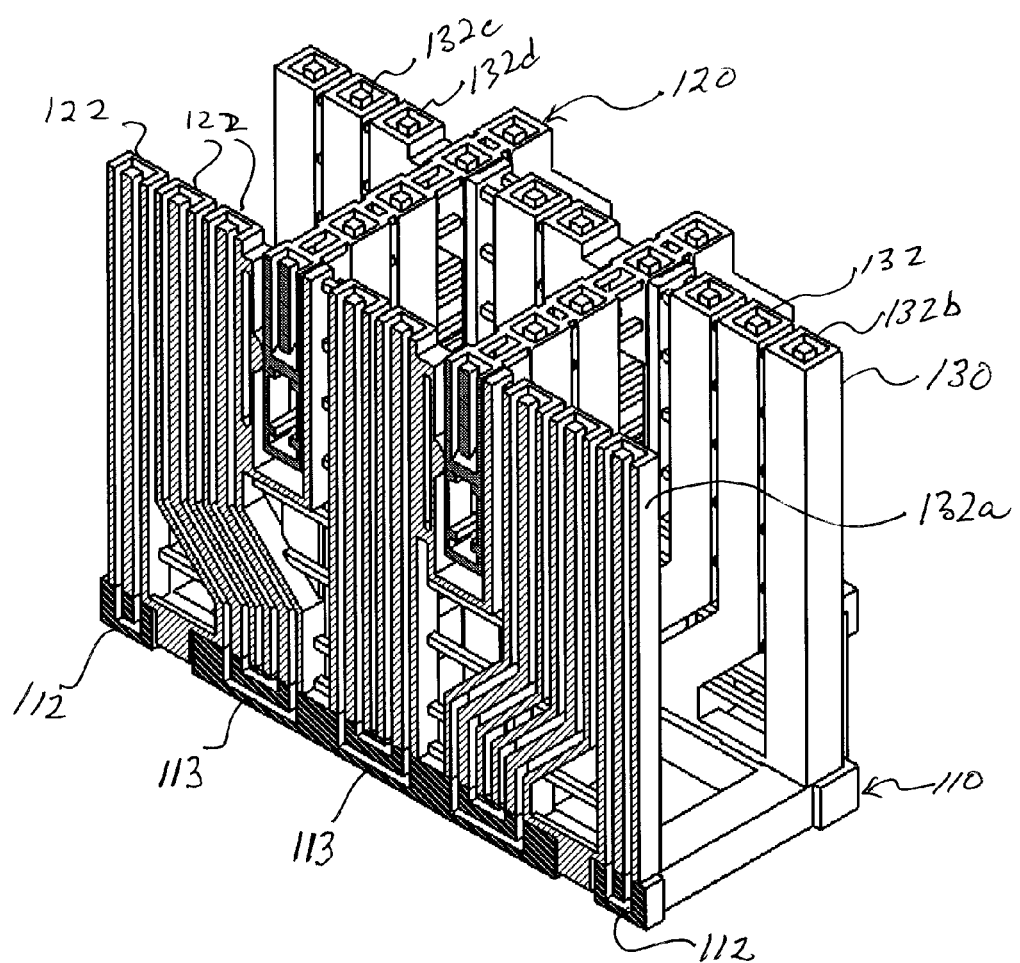
FIG. 7 schematically illustrates an isometric cross-sectional view of the assembled substrate-free, interconnected electronic mechanical structural system of FIG. 6A taken along the sectioning line A-A.
Figure 8:
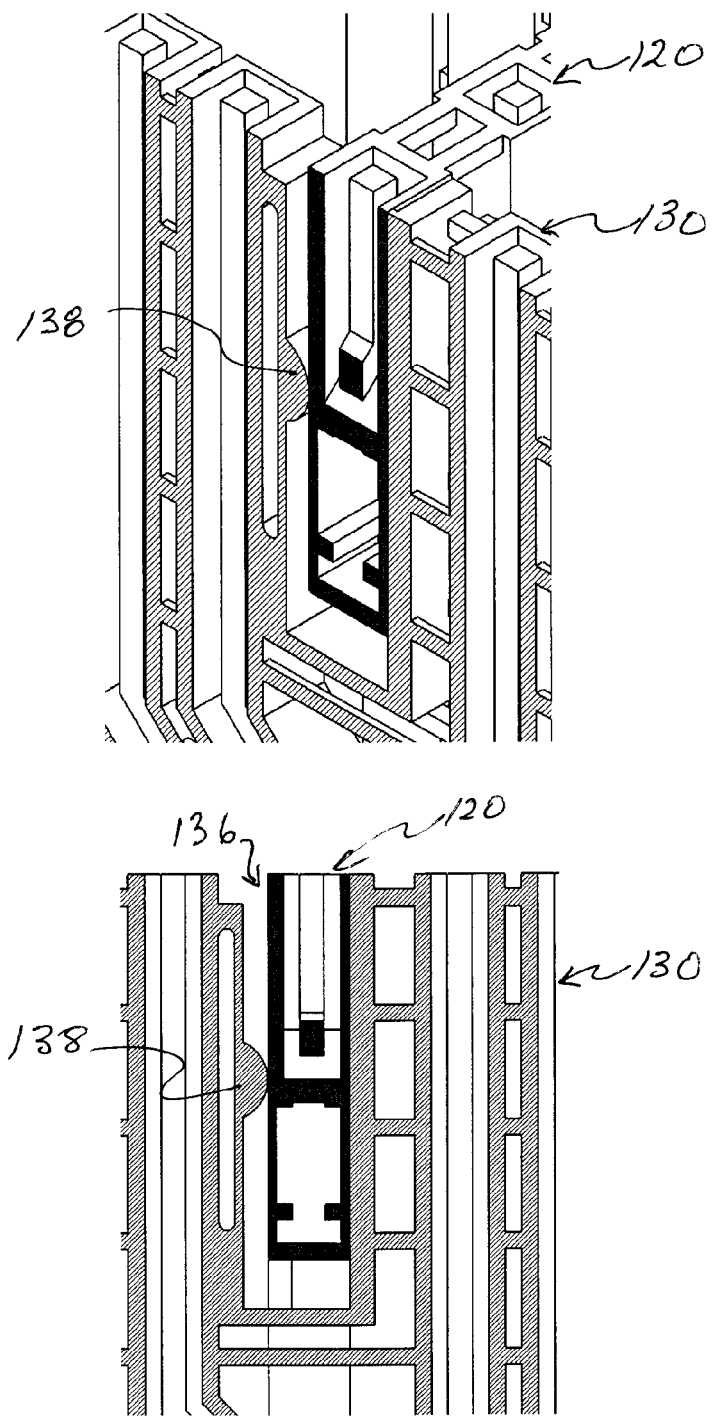
FIG. 8 schematically illustrates isometric and front cross-sectional views of an enlarged portion of the upper electronic mechanical structural system comprised of two interlocked subsystems, and also illustrates a justification spring for aligning the first and second substrate-free, electronic mechanical subsystems.

Sufficient control of the mechanical tolerancing that determines the relative placement and interconnection of the electronic components of the subsystems 120, 130 and base plate 110 may be provided by one or more mechanical features. For example, complementary mating slots 126, 136 may be provided in each of the first and second substrate-free, electronic subsystems 120, 130, with each slot extending, for instance, along a portion of the height of the subsystem 120, 130 in which it is located. Respective slots 126 (FIG. 3), 136 (FIG. 4) of the first and second subsystems 120, 130 may be inserted into one another to effect mechanical alignment and joining of the first and second subsystems 120, 130, FIGS. 2-4. FIGS. 6B and 7 schematically illustrate a cross-sectional view taken along an array of coaxial waveguides 132 of the second substrate-free, electronic subsystem 130, and show cutaway portions of the first substrate-free, electronic subsystem 120 disposed in slots of the second subsystem 130. Enlarged portions of FIGS. 6B and 7 are shown in FIG. 8 to better illustrate how the first substrate-free, electronic subsystem 120 may be disposed within a slot 136 of the second substrate-free, electronic subsystem 130.

Figure 9:
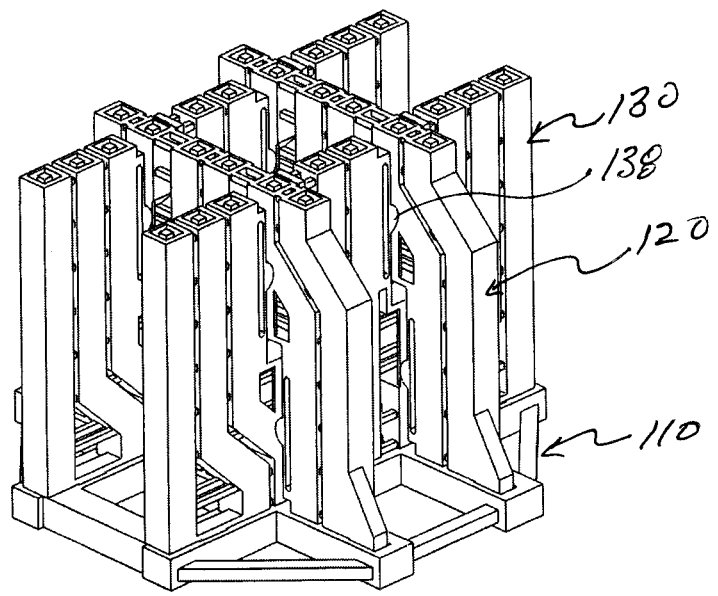
FIG. 9 schematically illustrates an isometric view of the assembled substrate-free, interconnected electronic mechanical structural system of FIG. 1 showing the location of the justification spring in the assembled system.
Figure 10:
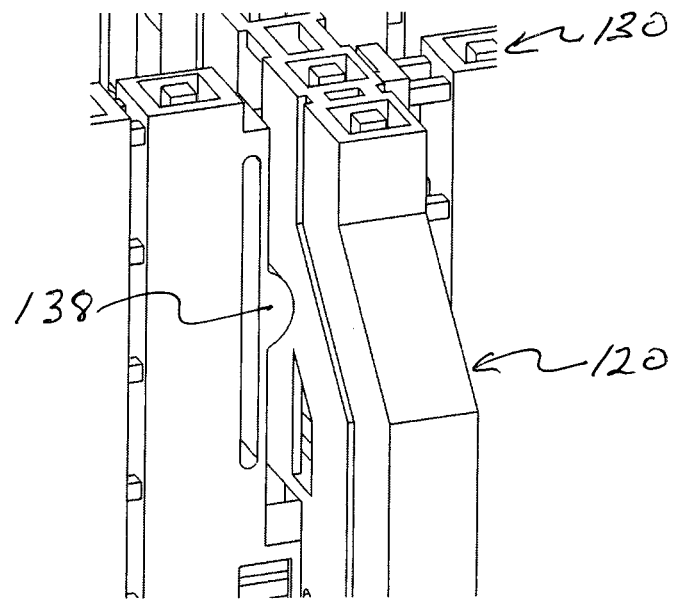
FIG. 10 schematically illustrates an enlarged view of the assembled substrate-free, interconnected electronic mechanical structural system of FIG. 9 showing the location of the justification spring in the assembled system.

To aid in the insertion of the first subsystem 120 in the slot 136 of the second subsystem 130, the width of the slot 136 may be wider than the width of the first subsystem 120. In fact the width of the slot 136 may be wider than that permitted by the tolerances required to align the coaxial waveguides 122, 132 of the first and second subsystems 120, 130 and base plate 110. Instead, lateral alignment tolerances may be maintained even though the slot 136 is wider than the first subsystem 120, by providing a justification spring 138 (FIGS. 3,4) that controls the location of the first substrate-free, electronic subsystem 120 within the slot 136 of the second substrate-free, electronic subsystem, FIGS. 8-10. While the justification spring 138 is shown in the form of a cylindrical bump-out, other suitable structures may be used such as a strap, beam, leaf spring, or cantilever to justify the first subsystem 120 against the opposing wall of the slot 136 of the second subsystem 130.

Turning to the mechanical alignment with the base plate 110 in more detail, the first and second substrate-free, electronic subsystems 120, 130 may include a number of mechanical mounting features to permit mechanical interconnection with the base plate 110. For example, alignment pegs 124 (FIG. 3), 134 (FIG. 4) of the first and second substrate-free, electronic subsystems 120, 130 may be provided and may be clearance fit or pressfit into corresponding holes 114 of the base plate 110, FIGS. 11A-11D. In addition, to assist in the alignment and assembly of the first and second substrate-free electronic subsystems 120, 130 and base plate 110, the slots 126, 136, holes 114, and/or mounting pegs 124, 134 may include mounting ridges 117 (FIG. 6B), 137 (FIG. 15B), 237 (FIG. 15B) to further constrain the alignment between slots 126, 136 to one another and/or mounting pegs 124, 134 to holes 114, FIGS. 15A, 15B.

One or more of the first and second substrate-free, electronic subsystems 120, 130 and substrate-free, electronic base plate 110 may be created by a suitable build layer manufacturing process, e.g., additive sequential build process, such as the PolyStrata® process of Nuvotronics, LLC as detailed above in the listed and incorporated US Patents. In the sequential build process, a structure is formed by sequentially layering various materials in a defined manner.

The present exemplary subsystems 110, 120, 130 and system 100 shown were chosen to demonstrate not some higher level system end purpose or particular function, other than to display how such substrate free electro-mechanical additive build structures made by a micro or meso-scale fabrication process can be designed to be sufficiently durable. The exemplary structures can serve as not only "board-less" circuit boards, but more so, they can have at least their mechanical, thermal, and electrical functions co-designed and modeled in such a way that durable systems can be assembled and formed from the subsystems joined both in plane and out their plane of fabrication. By eliminating excess material, they can truly be optimized for size, weight, performance, and power. A three dimensional volume may be optimally filled allowing both form and function to cast off many of the usual shackles stemming from the traditional manufacturing method limitations that usually faced in their design and production. Accordingly, these and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. A substrate-free, interconnected electronic mechanical structural system, comprising:
    a first substrate-free, electronic subsystem including an electronic component therein, the subsystem comprised of a plurality of sequential layers and having a slot extending along a longitudinal axis of the subsystem; and
    a second substrate-free, electronic subsystem including an electronic component therein, the second subsystem comprised of a plurality of sequential layers and having a complementary mating slot extending along a longitudinal axis of the second subsystem, wherein the complementary mating slot of the second subsystem is disposed within the slot of the first subsystem to effect mechanical alignment and joining of the first and second subsystems.

2. The substrate-free, interconnected electronic mechanical structural system according to claim 1, wherein the electronic component on at least one of the first and second subsystems comprises a coaxial waveguide.

3. The substrate-free, interconnected electronic mechanical structural system according to claim 1, wherein the electronic component on at least one of the first and second subsystems comprises one or more of a heterogeneous component and a monolithic component.

4. The substrate-free, interconnected electronic mechanical structural system according to claim 1, wherein the electronic component on at least one of the subsystems comprises an electromechanical component.

5. The substrate-free, interconnected electronic mechanical structural system according to claim 1, wherein the first and second substrate-free, electronic subsystems are disposed in one or more of electrical, thermal, optical, and/or fluidic communication.

6. The substrate-free, interconnected electronic mechanical structural system according to claim 1, wherein the electronic component on at least one of the first and second subsystems comprises a mechanically interconnected DC and RF transmission lines.

7. The substrate-free, interconnected electronic mechanical structural system according to claim 1, wherein the longitudinal axes of the first and second subsystems are oriented parallel to one another.

8. A substrate-free, interconnected electronic mechanical structural system, comprising:
    a first substrate-free, electronic subsystem including an electronic component therein, the subsystem having a slot extending along a longitudinal axis of the subsystem; and
    a second substrate-free, electronic subsystem including an electronic component therein, the second subsystem having a complementary mating slot extending along a longitudinal axis of the second subsystem, wherein the complementary mating slot of the second subsystem is disposed within the slot of the first subsystem to effect mechanical alignment and joining of the first and second subsystems, wherein the electronic component on at least one of the first and second subsystems comprises a coaxial waveguide.

9. A substrate-free, interconnected electronic mechanical structural system, comprising:
    a first substrate-free, electronic subsystem including an electronic component therein, the subsystem having a slot extending along a longitudinal axis of the subsystem; and
    a second substrate-free, electronic subsystem including an electronic component therein, the second subsystem having a complementary mating slot extending along a longitudinal axis of the second subsystem, wherein the complementary mating slot of the second subsystem is disposed within the slot of the first subsystem to effect mechanical alignment and joining of the first and second subsystems, comprising a generally planar base subsystem having electronic component therein, the base mechanically connected to the first and second subsystems at respective ends thereof.

10. The substrate-free, interconnected electronic mechanical structural system according to claim 9, wherein the planar base is disposed orthogonal to the longitudinal axis of the first subsystem.

11. The substrate-free, interconnected electronic mechanical structural system according to claim 9, wherein the planar base is disposed in one or more of electrical, thermal, optical, and/or fluidic communication with the first subsystem.

12. The substrate-free, interconnected electronic mechanical structural system according to claim 9, wherein the electronic component of the first subsystem communicates with the electronic component of the second subsystem via the base.

13. The substrate-free, interconnected electronic mechanical structural system according to claim 12, wherein at least one of the first and second subsystems is comprised of a plurality of sequential layers.

14. The substrate-free, interconnected electronic mechanical structural system according to claim 9, wherein at least one of the first and second subsystems is comprised of a plurality of sequential layers.

15. A substrate-free, interconnected electronic mechanical structural system, comprising:
    a first substrate-free, electronic subsystem including an electronic component therein, the subsystem having a slot extending along a longitudinal axis of the subsystem;
    a second substrate-free, electronic subsystem including an electronic component therein, the second subsystem having a complementary mating slot extending along a longitudinal axis of the second subsystem, wherein the complementary mating slot of the second subsystem is disposed within the slot of the first subsystem to effect mechanical alignment and joining of the first and second subsystems; and
    connection features of the first substrate-free, electronic subsystem having a spring configured to orient and retain the second-substrate-free, electronic subsystem in position relative to the first substrate-free, electronic subsystem.

16. The substrate-free, interconnected electronic mechanical structural system according to claim 15, wherein at least one of the first and second subsystems is comprised of a plurality of sequential layers.

17. A substrate-free, interconnected electronic mechanical structural system, comprising:

a first substrate-free, electronic subsystem including an electronic component therein, the subsystem having a slot extending along a longitudinal axis of the subsystem; and a second substrate-free, electronic subsystem including an electronic component therein, the second subsystem having a complementary mating slot extending along a longitudinal axis of the second subsystem, wherein the complementary mating slot of the second subsystem is disposed within the slot of the first subsystem to effect mechanical alignment and joining of the first and second subsystems, wherein the first and second subsystems are generally planar structures disposed orthogonal to one another.

18. The substrate-free, interconnected electronic mechanical structural system according to claim 17, wherein at least one of the first and second subsystems is comprised of a plurality of sequential layers.

19. A substrate-free, interconnected electronic mechanical structural system, comprising:

a first substrate-free, electronic subsystem including an electronic component therein, the subsystem having a slot extending along a longitudinal axis of the subsystem; and a second substrate-free, electronic subsystem including an electronic component therein, the second subsystem having a complementary mating slot extending along a longitudinal axis of the second subsystem, wherein the complementary mating slot of the second subsystem is disposed within the slot of the first subsystem to effect mechanical alignment and joining of the first and second subsystems, wherein the electronic component on at least one of the first and second subsystems comprises an antenna.

20. The substrate-free, interconnected electronic mechanical structural system according to claim 19, wherein at least one of the first and second subsystems is comprised of a plurality of sequential layers.

\* \* \* \* \*